(12) United States Patent
Lim et al.

(10) Patent No.: US 10,811,567 B2
(45) Date of Patent: Oct. 20, 2020

(54) LIGHT EMITTING MODULE AND A DISPLAY DEVICE

(71) Applicant: LG INNOTEK CO., LTD., Seoul (KR)

(72) Inventors: Woo Sik Lim, Seoul (KR); Hyun Joon Kim, Seoul (KR); Jae Seok Park, Seoul (KR); Jong Seok Park, Seoul (KR); Kum Tae Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 74 days.

(21) Appl. No.: 16/082,237

(22) PCT Filed: Mar. 2, 2017

(86) PCT No.: PCT/KR2017/002256
§ 371 (c)(1),
(2) Date: Sep. 4, 2018

(87) PCT Pub. No.: WO2017/150910
PCT Pub. Date: Sep. 8, 2017

(65) Prior Publication Data
US 2020/0091376 A1    Mar. 19, 2020

(30) Foreign Application Priority Data
Mar. 2, 2016  (KR) .......................... 10-2016-0025362

(51) Int. Cl.
*H01L 33/40*     (2010.01)
*H01L 27/15*     (2006.01)
(Continued)

(52) U.S. Cl.
CPC ............ *H01L 33/40* (2013.01); *H01L 27/156* (2013.01); *H01L 33/56* (2013.01); *H01L 33/62* (2013.01)

(58) Field of Classification Search
None
See application file for complete search history.

(56) References Cited

U.S. PATENT DOCUMENTS

2012/0119237 A1    5/2012 Leatherdale et al.
2014/0312368 A1    10/2014 Lee et al.

FOREIGN PATENT DOCUMENTS

JP      2015-153931 A       8/2015
JP      2015153931 A  *    8/2015
(Continued)

OTHER PUBLICATIONS

International Search Report for PCT/KR2017/002256 (PCT/ISA/210) dated Jun. 14, 2017.

*Primary Examiner* — Steven M Christopher
(74) *Attorney, Agent, or Firm* — Birch, Stewart, Kolasch & Birch, LLP

(57) ABSTRACT

Embodiments is disclosed a light emitting module and a display device. The light emitting module includes, a substrate, a first lead electrode and a second lead electrode disposed on the substrate and electrically separated from each other; and at least one light emitting device disposed on the substrate, wherein the light emitting device includes a first electrode facing the first lead electrode and including a ferromagnetism material and a second electrode facing the second lead electrode and including a diamagnetism material, wherein the second lead electrode includes a diamagnetism material, and wherein the first lead electrode comprises a ferromagnetism material.

16 Claims, 22 Drawing Sheets

(51) Int. Cl.
*H01L 33/56* (2010.01)
*H01L 33/62* (2010.01)

(56) References Cited

FOREIGN PATENT DOCUMENTS

| | | |
|---|---|---|
| KR | 10/2011-0087603 A | 8/2011 |
| KR | 10-2011-0109289 A | 10/2011 |
| KR | 10-2012-0038539 A | 4/2012 |
| KR | 10-1149059 B1 | 5/2012 |
| KR | 10-2015-0134550 A | 12/2015 |
| KR | 10-2016-0062777 A | 6/2016 |

* cited by examiner

LIGHT EMITTING MODULE AND A DISPLAY DEVICE

CROSS REFERENCE TO RELATED APPLICATIONS

This application is the National Phase of PCT International Application No. PCT/KR2017/002256, filed on Mar. 2, 2017, which claims priority under 35 U.S.C. 119(a) to Patent Application No. 10-2016-0025362, filed in the Republic of Korea on Mar. 2, 2016, all of which are hereby expressly incorporated by reference into the present application.

TECHNICAL FIELD

Embodiment relates to a light emitting module and a display apparatus having the same.

Embodiment relates to a light emitting module manufacturing method.

BACKGROUND ART

The LED (Light Emitting Diode) is one of the light emitting device is applied to a current emit light. Light emitting diodes are excellent energy saving effect may be emitted with a high efficiency of the optical low voltage. Recently, the brightness problem of the LED is significantly improved, and the LED is applicable to various devices such as a backlight unit of a liquid crystal display, signboard, display, and home appliances.

Typical liquid crystal display device displays an image or video by controlling the light transmittance of the light emitted from the liquid crystal light emitting diodes pass through the color filter. Recently, a liquid crystal display and organic electroluminescent display device having a complicated configuration but have been required display apparatus of high definition (HD) and large high definition or more displays, commonly used mainly in the difficulties in implementing a large display device of high definition by the yield and the cost there was.

DISCLOSURE

Technical Problem

The embodiment may provide a light emitting module and a display device having the same that includes a light emitting device having a ferromagnetism material.

The embodiment provides a light emitting module having the same and a display device that any one of electrodes of the light emitting device and any one of the lead electrodes of substrate has a ferromagnetism material.

Embodiment provides a light emitting module having the same and a display device that a first electrode and a first lead electrode facing each other to the light emitting device and the substrate has a ferromagnetism material, and a second electrode and a second lead electrode facing each other to the light emitting device and the substrate has a diamagnetic material.

Embodiments provide a display device in which any one of electrodes of a plurality of light emitting devices emitting different colors in each of a plurality of pixel regions has a ferromagnetism material and is bonded to one of the lead electrodes of the substrate.

The embodiment provides a light emitting module and a display device having the same that a light emitting diodes emits light of a different color for wide color reproduction.

The embodiment provides a light emitting module and a display device having the same that may improve productivity and yield.

The embodiment provides a display device that may implement a large high-resolution display device.

The embodiment provides an excellent display device with color purity and a color reproduction.

Technical Solution

A light emitting module of embodiment comprising: a substrate; a first lead electrode and a second lead electrode disposed on the substrate and electrically separated from each other; and at least one light emitting device disposed on the substrate, wherein the light emitting device includes a first electrode facing the first lead electrode and including a ferromagnetism material and a second electrode facing the second lead electrode and including a diamagnetism material, wherein the second lead electrode includes a diamagnetism material, and wherein the first lead electrode comprises a ferromagnetism material.

A display device according to the embodiment comprises: a substrate including first and second lead electrodes; a plurality of light emitting units on the substrate; and a black matrix surrounding the plurality of light emitting units, respectively, wherein each of the plurality of the light emitting units includes; at least three light emitting devices forming each pixel region and disposed on the substrate and a light transmitting layer on the substrate, wherein the light emitting device includes a first electrode facing the first lead electrode and including a ferromagnetism material, and a second electrode facing the second lead electrode and including a diamagnetism material, and wherein the second lead electrode includes a diamagnetism material.

According to an embodiment, the second lead electrode is formed of a diamagnetism material, the second electrode may include a paramagnetism material.

According to embodiment, the ferromagnetism material comprises nickel (Ni), the diamagnetic materials may include a copper (Cu).

According to an embodiment, the first lead electrode and at least one of the first electrode comprises a first bonding layer, and the first bonding layer may have the ferromagnetism material of the first electrode. At least one of the second lead electrode and the second electrode includes a second bonding layer, and the second bonding layer may have the diamagnetism material of the second lead electrode.

According to the embodiment, the first bonding layer has a thickness greater than a thickness of the first lead electrode, and the second bonding layer may have a thickness greater than a thickness of the second lead electrode.

According to an embodiment, the first electrode of the light emitting device has a plurality of spaced apart from each other, the second electrode of the light emitting device has a plurality may be separated from each other.

According to an embodiment, comprising a plurality of pixel regions on the substrate, wherein the at least one light emitting device is disposed in each pixel region and the light emitting device disposed in each pixel region includes a first to third light emitting devices emitting light of different color from each other.

According to an embodiment, wherein the light emitting device include the first to third light emitting devices that emit light of different colors as sub-pixels.

Advantageous Effects

The embodiments may arrange one or a plurality of light emitting devices on a substrate by ferromagnetism, thereby reducing the arrangement time of the light emitting device(s).

The embodiments may reduce a bonding time of the light emitting device(s), thereby bonding the electrodes of the light emitting device in disposed of ferromagnetism on the substrate.

The embodiments may sequentially arrange and bond the light emitting devices emitting different colors on the substrate, so that the arrangement and bonding time of the light emitting devices emitting different colors may be reduced.

The embodiment may arranged and mounted the light emitting devices on the substrate in a ferromagnetism, so that the arrangement and mounting of light emitting devices of a small size are easy.

The embodiment may implement a full color with one pixel as a plurality of light emitting diodes.

The embodiments may implement a display device of high luminance and high reproducibility by arranging light emitting diodes emitting different colors in one pixel as subpixels.

The embodiment may simplify the configuration and has advantages profitable to slimming.

The embodiment may improve the productivity and improve the yield.

The embodiment simplifies the driving circuit by the light emitting devices having a constant operating voltage and can be easily controlled.

The embodiment may realize a large display device having excellent image and visual straightness.

The embodiment may realize a display device having excellent color purity and color reproduction.

BEST MODE

It will be described in detail so that the invention may be easily implemented by those of ordinary skill, in which with respect to the embodiment of the present invention with reference to the accompanying drawings. However, the invention is not to be implemented in many different forms and limited to the embodiments set forth herein.

In the specification, assuming that any part "includes" a certain component, which is not to exclude other components not specifically described against which means that it is possible to further include other components. Whenever a portion of a layer, film, region, plate, or the like is referred to as being "on" another portion, it includes not only the case where it is "directly on" another portion, but also the case where there is another portion in between. Conversely, when a part is "directly on" another part, it means that there is no other part in the middle.

The light emitting device referred to in the present specification includes a light emitting diode (LED), and each of the light emitting diodes can emit a single peak wavelength or a plurality of peak wavelengths. Each of the light emitting diodes may be formed of an LED chip, a phosphor layer may be provided on the LED chip, or a light emitting diode package in which the LED chip is packaged may be selectively used. The phosphor layer is excited by the light emitted from the LED chip to emit a peak wavelength of one or more colors. The light emitting diode according to the embodiment may include an element such as a Zener diode or a FET, which may be implemented by a semiconductor laminated structure. To easily explain various embodiments of the present invention, a device having an LED and a structure added thereto will be described as a light emitting device.

Figure 1:
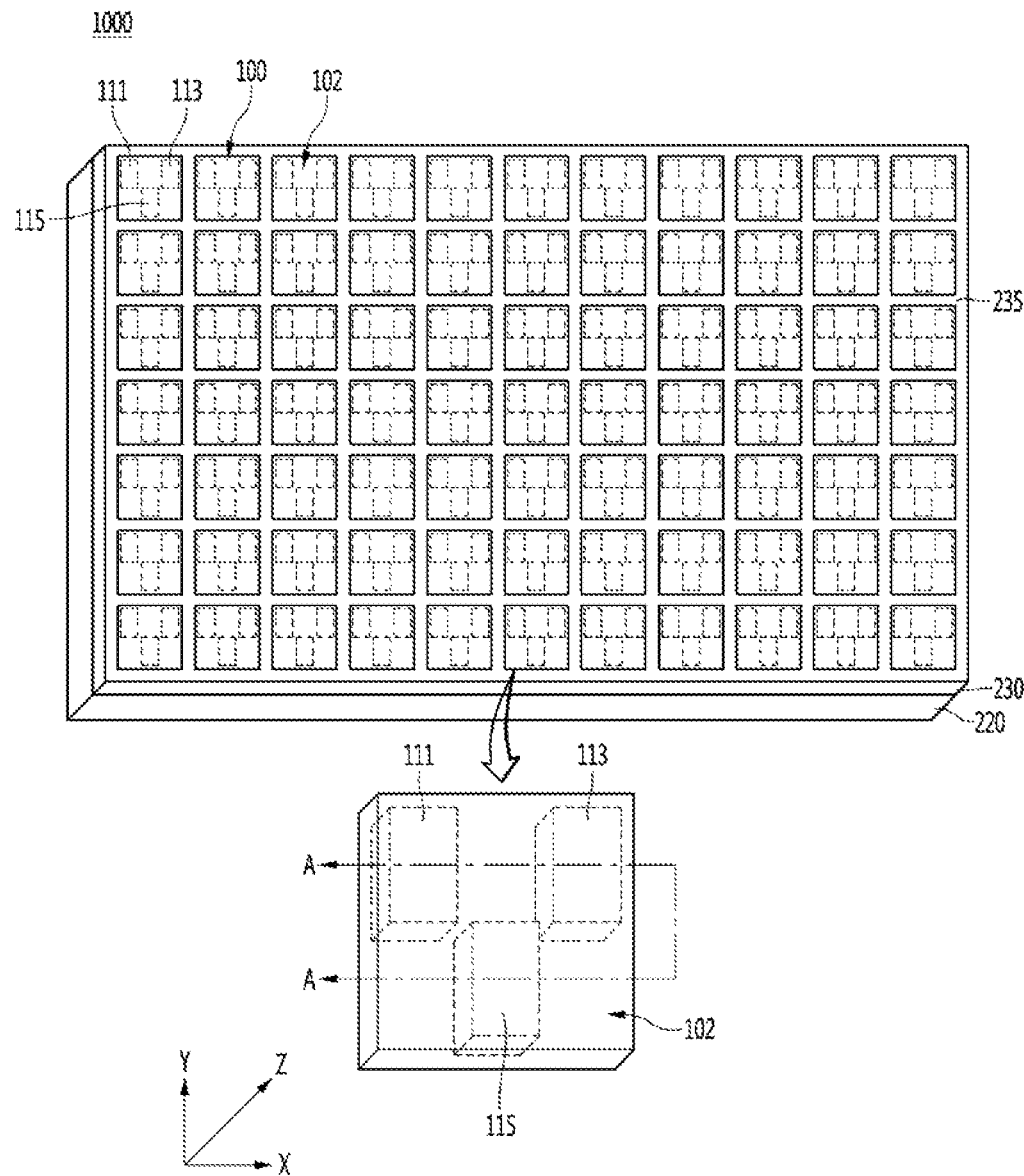
FIG. 1 is a perspective view showing an embodiment of a light emitting module and a display apparatus having the same.
Figure 2:
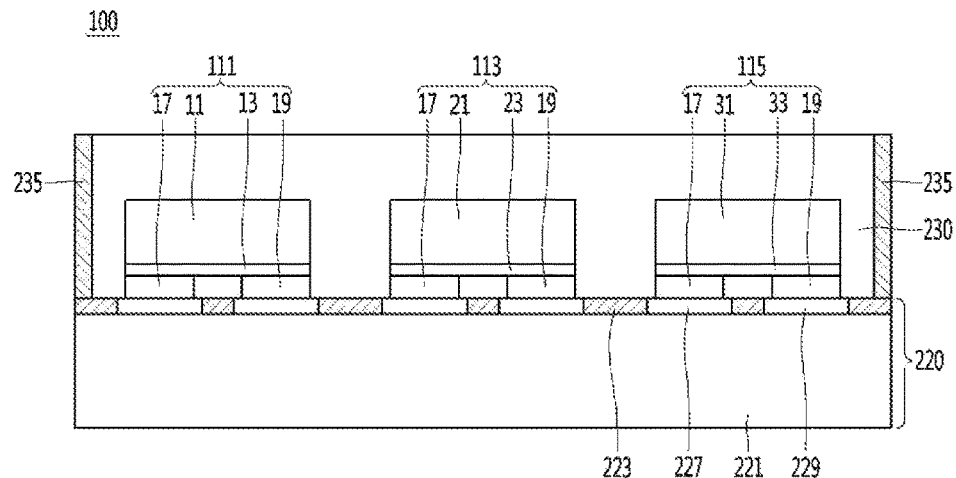
FIG. 2 is an A-A cross-sectional view showing a pixel region of the light emitting module of FIG. 1.
Figure 3:
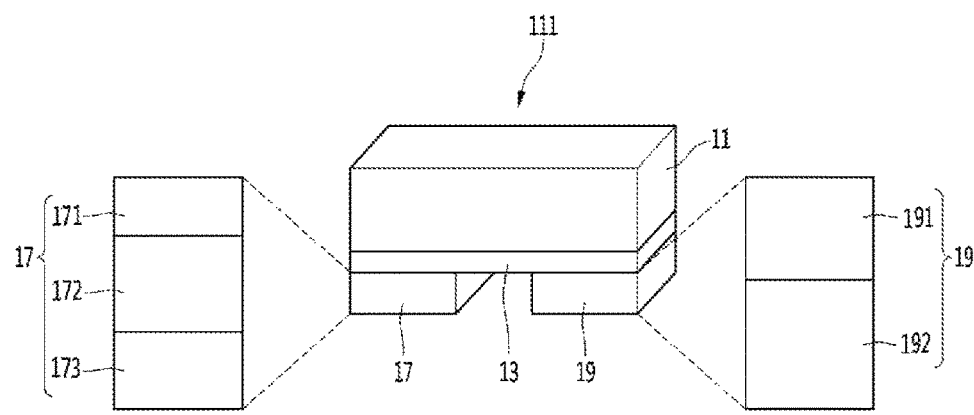
FIG. 3 is a detailed structure view of the electrode of the first light emitting device in a light emitting module of FIG. 1 as the first embodiment.
Figure 4:
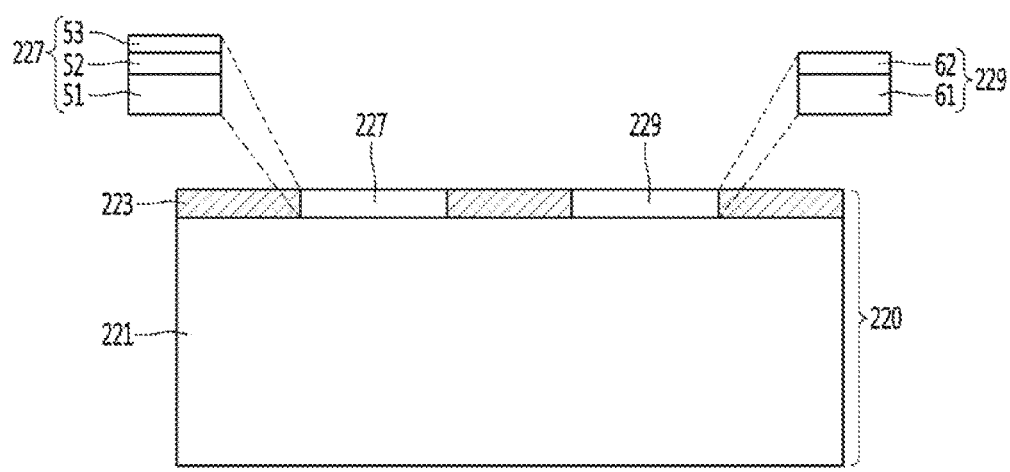
FIG. 4 is a detailed structure view of the lead electrode of the substrate of FIG. 1 as the first embodiment.
Figure 5:
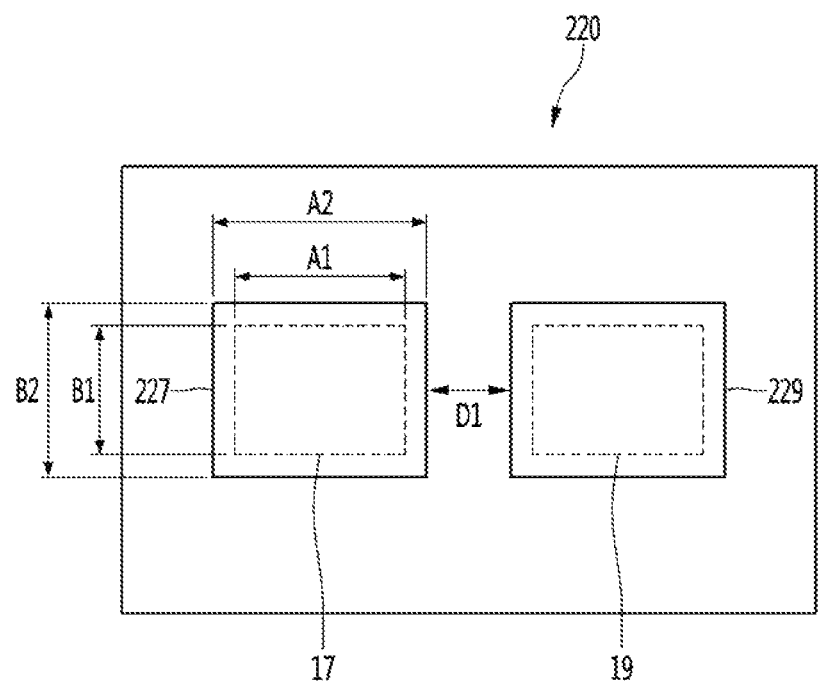
FIG. 5 is a view comparing the size of the lead electrodes of the substrate and the electrode of the light emitting device in the light emitting module of FIG. 1.

FIG. 1 is a perspective view showing an embodiment of a light emitting module and a display apparatus having the same, FIG. 2 is an A-A cross-sectional view showing a pixel region of the light emitting module of FIG. 1, FIG. 3 is a detailed structure view of the electrode of the first light emitting device in a light emitting module of FIG. 1 as the first embodiment, FIG. 4 is a detailed structure view of the lead electrode of the substrate of FIG. 1 as the first embodiment, and FIG. 5 is a view comparing the size of the lead electrodes of the substrate and the electrode of the light emitting device in the light emitting module of FIG. 1.

Referring to FIG. 1, the light emitting module 1000 according to the embodiment may include a plurality of light emitting units 100 and the substrate 220. Each of the light emitting unit 100 may be defined a single pixel region 102, and the pixel region 102 is a number of M rows×N columns (M≥1, N≥1, M+N≥2) on the substrate 220. The pixel region 102 may be a unit pixel having a plurality of sub-pixels, there is a blue, green and red light may be emitted. Each of the pixel region 102 includes, for example, a plurality of sub-pixels, for example, different colors, and may include a plurality of light emitting devices 111, 113 and 115 that at least three color light emitting color. Each of the plurality of light emitting devices 111, 113 and 115 is a light emitting diode which emits light of a different color, or light emitting diodes for emitting the same color as each other, may be at least a light emitting diode to emit light two are the same color. The light emitting unit 100 may include the substrate 220, the plurality of light emitting devices 111, 113 and 115 and the light transmitting layer 230.

The light emitting devices 111, 113 and 115 in the pixel region 102 have, for example, a light emitting device of blue, green and red, and each may be disposed in sub-pixels in each pixel region 102. The each light emitting devices 111, 113 and 115 is may be implemented as light emitting diodes, it is possible to minimize the pixel pitch. Pitch between pixel regions 102 in the display device having the light emitting module 1000 may be less than 1.2 mm, for example, to have in a range of 0.6 mm to 0.9 mm, and may improve the pixel density and resolution. For example, when the display device may implemented in a SD (Standard Definition) grade resolution (760×480), HD (High definition) grade resolution (1180×720), FHD (Full HD) grade resolution (1920×1080), UH (Ultra HD) grade resolution (3480×2160), or UHD grade or higher resolution (for example: 4K (K=1000), 8K, etc.), the light emitting module 1000 according to the embodiment may be arranged and connected in a plurality. Or with a diagonal size of the display device it may be implemented more than 100 inches match or TV to the pixel having the LED. Whereby the light emitting module 1000 is arranged in the LED according to the embodiment, the power consumption may be reduced and a long lifetime at a low maintenance cost may be provided, and it may provide in a self-luminous display of high luminance.

Display device according to the embodiment comprises the light emitting module 1000 may disposed in one or a plurality, and comprises a one or plurality of driving boards (not shown) which is disposed under the substrate 220 of the light emitting module 1000. The driving board may be a plurality of electrically connected to the pixel region 1000 through the substrate 220, and controls an selective on/off of the light emitting devices 111, 113 and 115 of the plurality of pixel regions 102. The driving board may include a driving circuit, but is not limited thereto.

<Substrate 220>

As shown in FIG. 2, the substrate 220 may be a support member for supporting a plurality of light emitting devices 111, 113 and 115. The substrate 220 may be a rigid substrate or a flexible substrate of the single-layer or multi-layer. The substrate 220 includes, for example, a printed circuit board (PCB) in resin type, a metal core (Metal Core) PCB, a flexible PCB, a ceramic PCB, or FR-4 substrate. The substrate 220 may comprise a film having an electrode pattern, for example, PI (polyimide) film, PET (polyethylene terephthalate) film, EVA (ethylene vinyl acetate) film, a PEN (polyethylene naphthalate) film, TAC (Tra-acetyl cellulose) film, PAI (polyamide-imide), PEEK (poly terry-ether-ketone), Perfluoroalkoxy (PFA), Polyphenylene sulfide (PPS), a resin film (PE, PP, and PET), and etc.

The substrate 220 may include a support layer 221, a plurality of lead electrodes 227 and 229 on the support layer 221, a protective layer 223 for protecting the plurality of lead electrodes 227 and 229. The support layer 221 may be formed of a metal, ceramic, FR-based resin material (for example: FR-4) or be formed of a film material. The support layer 221 may be improved heat radiation characteristics when the metal or ceramic material. When the support layer 221 is an FR based resin material, and the cost may be reduced. The plurality of lead electrodes 227 and 229 may be separated from each other, may be formed of a metallic material, and may be disposed under each light emitting devices 111, 113 and 115 of the light emitting unit 100. The lead electrodes 227 and 229 may comprise the at least two lead electrodes for example, first and second lead electrodes 227 and 229 disposed under each of the light emitting devices 111, 113 and 115. The each of light emitting devices 111, 113 and 115 is electrically connected with the lead electrodes 227 and 229 disposed under each of the light emitting devices 111, 113 and 115 and is receive power.

The protective layer 223 may be disposed between the light transmitting layer 230 and the substrate 110. The protective layer 223 may be disposed between the lead electrodes 227 and 229. The protective layer 223 may be disposed around each of the lead electrodes 227 and 229. With such the protection layer 223 may protect the circuit pattern having the lead electrodes 229 and 229 on the substrate 220. The protective layer 223 may be formed of a material or an insulating material or a material such as a solder resist. As another example, the protective layer 223 may include, for example, at least one of $SiO_2$ layer, $Si_3N_4$ layer, $TiO_2$ layer, $Al_2O_3$ layer, and MgO layer. As another example, the substrate 220 may further include an insulating layer under the lead electrodes 217 and 219, but is not limited thereto.

The protective layer 223 may be formed of a black matrix material, the black matrix material may improve the contrast ratio on the substrate 220. The protective layer 223 may be implemented in a single layer or multiple layers. Here, when the protective layer 223 is a black matrix material, for example, the protective layer 223 is implemented in a carbon black, Graphite or poly-pyrrole. When the protective layer 223 is a black matrix material, the protective layer 223 may be formed in a single layer or multi-layer structure using a chromium (Cr), but is not limited thereto. That is, the black matrix material is supplied in powder form, so there is a tendency for the powder to squeeze together, so it is difficult to apply uniformity if the layer thickness is less than a range. The surface of the black matrix material are formed a roughness, such as a concave-convex pattern, it may control the light diffusion property. The protective layer 223 may be a light-absorbing layer may have a high light absorption rate than that of the lead electrodes 227 and 229. The thickness of the protective layer 223 is less than 100 μm for example, in a range of 5 μm to 100 μm range, when the thickness is below the above range may not be the black body radiation and is difficult to obtain with a uniform thickness. The substrate according to an embodiment may be a lead electrode disposed without the protective layer.

The thickness of the substrate 220 may be formed of more than 100 μm, for example, in a range of 100 μm to 500 μm, for example, in a range of 100 μm 400 μm. When the thickness of the substrate 220 is larger than the above range, there is difficulty in processing a via electrode (not shown), wherein the thickness is thinner than the above range, handling is difficult and is occur cracks or a scratches problem. By providing the substrate 220 with the thickness described above, it is possible to support the light emitting devices 111, 113 and 115 and may prevent a decrease in heat radiation efficiency. The substrate 220 may include a via electrode connected to the lead electrodes 227 and 228 of the substrate 220 and a lower electrode connected to the via electrode on the bottom surface, but is not limited thereto.

<Light Transmitting Layer 230>

The light transmitting layer 230 may be disposed on the substrate 220. The light transmitting layer 230 may transmit the light emitted from the light emitting devices 111, 113 and 115. The light transmitting layer 230 may transmit through the top surface or top surface and side surfaces the light. Here, a reflective member is disposed on a periphery of the light emitting devices 111, 113 and 115 for an extraction of light, for example, the member on which the resin material is added a metal compound therein is further disposed, but is not limited thereto.

An impurity such as a dispersant may be added in the light transmitting layer 230, but is not limited thereto. The light transmitting layer 230 may include a transparent material such as a resin material, for example, silicone or epoxy. The light transmitting layer 230 may be implemented in a transparent film, but is not limited thereto.

The light transmitting layer 230 may be disposed in a size which covers the pixel region 102. The light transmitting layer 230 is to cover the lead electrodes 227 and 229, the light emitting devices 111, 113 and 115 and the protection layer 213. The surface of the light transmitting layer 230 may include a roughness or a lens shape such as a concave-convex pattern, the roughness may reduce the external diffuse reflection, and the lens shape may be controlled for the emitted light orientation distribution.

As shown in FIG. 1, a wall having a black matrix 235 at a boundary region between the pixel regions 102, the light transmitting layer 230 may be disposed. The black matrix 235 may include the ability to be placed in the boundary region between the pixel regions 102, prevent light leakage and improve the appearance quality. The black matrix 235 may be a non-transparent organic materials. For example, the black matrix 235 may be a black resin. The black matrix 235 may include an openings corresponding to the first to third light emitting devices 111, 113 and 115, one of the openings is corresponding to one pixel region 102 of the display device and receives a light emitting unit 100. A height (vertical thickness) of the black matrix 235 may be the same as the thickness of the light transmitting layer 230, but is not limited thereto. The black matrix 235 may be a matrix structure that covers all of the outer sides of a pixel region 102 rather than one pixel region 102. The black matrix 235 blocks interferences of light between adjacent light emitting units 100 and provides a screen of block color at the time of stopping the driving of the display device so that the appearance quality may be improved and may improve the implementation of confidence of the color of each pixel. Embodiment are provided a light emitting module 1000 capable of realizing images and images by implementing full color, and can simplify the structure of the light emitting module 1000 to realize slimness and high brightness.

<Light Emitting Device>

Referring to FIG. 2, each of the light emitting units 100 includes a plurality of light emitting devices, for example, first to third light emitting devices 111, 113 and 115. The first light emitting device 111 is a blue light emitting device, the second light emitting device 113 may be a green light emitting device, the third light emitting device 115 is red light emitting device.

Figure 16:
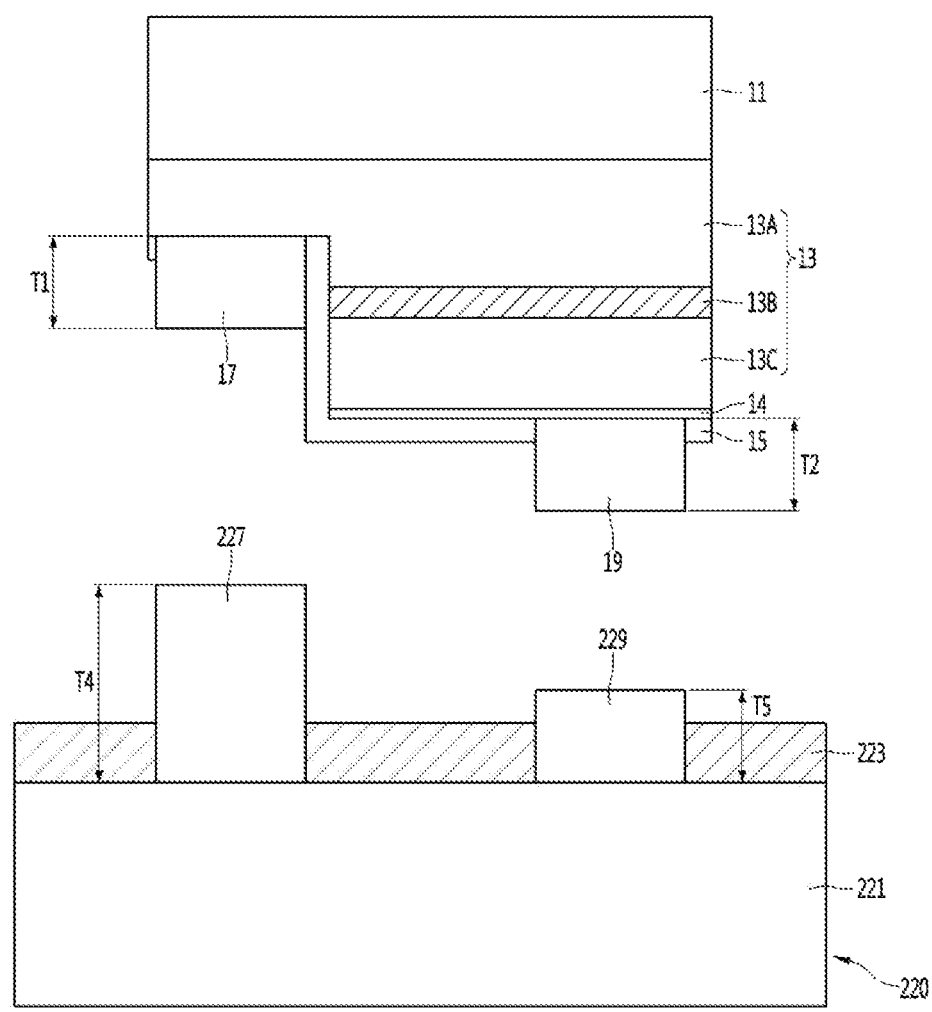
FIG. 16 is a view showing a mounting example according to the thickness difference between the lead electrodes of the substrate in the light emitting module according to an embodiment.

The first light emitting device 111 includes a first light emitting structure 13 and a plurality of electrodes 17 and 19, the first light emitting structure 13 may include at least one of group II-VI compound semiconductor and group III-V compound semiconductor. The first light emitting structure 13 may comprise a semiconductor material having a composition formula of $In_xAl_yGa_{1-x-y}N$ ($0 \leq x \leq 1$, $0 \leq y \leq 1$, $0 \leq x+y \leq 1$), but is not limited thereto. The first light emitting structure 13 may include a first conductive type semiconductor layer 13A, an active layer 13B and the second conductive type semiconductor layer 13C as shown in FIG. 16. The electrodes 17 and 19 of the first light emitting device 11, for example, includes a first electrode 17 and second electrode 19 separated from each other, the first electrode 17 is connected to the first conductive type semiconductor layer (13A in FIG. 16), the second electrode 19 may be connected to the second conductive type semiconductor layer (13B in FIG. 16). The first light emitting device 111 may include a light transmitting substrate 11 on the first light emitting structure 13, the light transmitting substrate 11 may include at least one of a sapphire ($Al_2O_3$), SiC, Si, GaAs, of GaN, ZnO, GaP, and InP. The first light emitting device 111 may be disposed without the light transmitting substrate 11.

The second light emitting device 113 includes a second light emitting structure 23 and a plurality of electrodes 17 and 19, the second light emitting structure 23 may include at least one of group II-VI compound semiconductor and group III-V compound semiconductor. The second light emitting structure 23 may comprise a semiconductor material having a composition formula of $In_xAl_yGa_{1-x-y}N$ ($0 \leq x \leq 1$, $0 \leq y \leq 1$, $0 \leq x+y \leq 1$), but is not limited thereto. The electrodes 17 and 19 of the second light emitting device 113 includes first and second electrodes 17 and 19 which are separated from each other and is connected to the second light emitting structure 23. The second light emitting device 113 may include a second light transmitting substrate 21 on the second light emitting structure 23, the second light transmitting substrate 21 may include at least one of a sapphire ($Al_2O_3$), SiC, Si, GaAs, of GaN, ZnO, GaP, and InP. The second light emitting device 113 may be disposed without the light transmitting substrate 21.

The third light emitting device 115 may include a third light emitting structure 33 and a plurality of electrodes 17 and 19, and the third light emitting structure 33 may include at least one of group II-VI compound semiconductor and group III-V compound semiconductor. The third light emitting structure 33 includes a semiconductor material having a composition formula of $In_xAl_yGa_{1-x-y}P$ ($0 \le x \le 1$, $0 \le y \le 1$, $0 \le x+y \le 1$) or $In_xAl_yGa_{1-x-y}N$ ($0 \le x \le 1$, $0 \le y \le 1$, $0 \le x+y \le 1$), and is not limited thereto. The electrodes 17 and 19 of the third light emitting device 115 comprises first and second electrodes 17 and 19 which are separated from each other, and is connected to the third light emitting structure 33 The third light emitting device 115 may include a light transmitting substrate 31 on the light emitting structure 33, the light transmitting substrate 31 may include at least one of a sapphire ($Al_2O_3$), SiC, Si, GaAs, GaN, ZnO, GaP, InP, Ge, and $Ga_2O_3$. The third light emitting device 115 may be arranged without the light transmitting substrate 31. As another example, the third light emitting device 115 may include a structure which a red phosphor layer is disposed on the light emitting structure emitting blue light, but is not limited thereto.

Referring to FIGS. 2 and 3, the first electrode 17 of the first light emitting device 111 faces the first lead electrode 227 of the substrate 220 and the first electrode 17 and the first lead electrode 227 are connected to each other, the second electrode 19 faces the second lead electrode 229 of the substrate 220 and the second electrode 19 and the second lead electrode 229 are connected to each other. Accordingly, the first light emitting device 111 may operate when supplied with power through the first and second lead electrodes 227 and 229 of the substrate 220. The first electrode 17 and second electrode 19 of the first light emitting device 111 may be bonded to the first lead electrode 227 and the second lead electrode 229 of the substrate 220, for example, metal bonded or eutectic bonded.

The first electrode 17 of the second light emitting device 113 faces the first lead electrode 227 of the substrate 220 and the first electrode 17 and the first lead electrode 227 are connected to each other, the second electrode 19 faces the second lead electrode 229 of the substrate 220 and the second electrode 17 and the second lead electrode 229 are connected to each other. Accordingly, the second light emitting device 113 may operate when supplied with power through the first and second lead electrodes 227 and 229 of the substrate 220. The first electrode 17 and second electrode 19 of the second light emitting device 113 may be bonded to the first lead electrode 227 and the second lead electrode 229 of the substrate 220, for example, metal bonded or eutectic bonded.

The first electrode 17 of the third light emitting device 115 faces the first lead electrode 227 of the substrate 220 and the first electrode 17 and the first lead electrode 227 are connected to each other, the second electrode 19 faces the second lead electrode 229 of the substrate 220 and the second electrode 19 and the second lead electrode 229 are connected to each other. Accordingly, the third light emitting device 115 may operate when supplied with power through the first and second lead electrodes 227 and 229 of the substrate 220. The third light emitting device 115 of the first electrode 17 and second electrode 19 is bonded to the first lead electrode 227 and the second lead electrode 229 of the substrate 220, for example, metal bonded or eutectic bonded.

The first to third light emitting devices 111, 113 and 115 may be individually driven. Here, any one of the first and second lead electrodes 227 and 229 connected to each of the first to third light emitting devices 111, 113 and 115 may be connected in common to an anode or a cathode of the first, second and third light emitting devices 111, 113 and 115, but is not limited thereto. At least one, two or all of the first, second and third light emitting devices 111, 113 and 115 may be flip-chip bonded on the substrate 220. The first, second and third light emitting devices 111, 113 and 115 may be, for example, lateral type or vertical type chip. The light emitting module 1000 according to the embodiment may improves the time and process for arranging and bonding hundreds of thousands of light emitting devices according to the resolution of the display device. In addition, the embodiment can perform the flip chip bonding of at least one or more light emitting devices 111, 113, and 115, thereby eliminating the bonding process of connecting the wires. In addition, due to the miniaturization of the chip size, there is a limit in the chip arrangement and movement quantity using the collet equipment, and the blue, red, and green light emitting devices are arrayed and bonded.

Embodiments may align or closely connect the light emitting devices 111, 113, and 115 to the substrate 220 using a ferromagnetism material strongly magnetized by an external magnetic field. In an embodiment, at least one or all of the light emitting devices 111, 113, and 115 include electrodes having a ferromagnetism material or a material having a ferromagnetism properties, and the substrate 220 may include the lead electrode having a ferromagnetism material or a material having a ferromagnetism properties, and the electrode having the ferromagnetism material and the lead electrode having the ferromagnetism material may be faced and connected to each other.

In the embodiment, any one of the two electrodes 17 and 19 of at least one or all of the first, second and third light emitting devices 111, 113, and 115 may include a ferromagnetism material, the other may include a ferromagnetism material and/or a paramagnetism material. Any one of the two lead electrodes 227 and 229 connected to the first to third light emitting devices 111, 113 and 115 according to the embodiment may include a ferromagnetism material and the other may include a diamagnetism material. The electrode and the lead electrode having the ferromagnetism material may be faced and connected to each other, and the electrode and the lead electrode having the diamagnetism material may face each other.

For example, the first electrode 17 of the first, second and third light emitting devices 111, 113, and 115 may include a ferromagnetism material and the second electrode 19 may include a diamagnetism material and/or a paramagnetism material. The first lead electrode 227 facing the first electrode 17 of each of the light emitting devices 111, 113 and 115 may include a ferromagnetism material and the second lead electrode 229 may include the diamagnetism material or a diamagnetism material and a paramagnetism material. The first electrode 17 may include a ferromagnetism material and a paramagnetism material. Hereinafter, the first electrode 17 may include the ferromagnetism material.

On the contrary, the second electrode 19 of the first, second and third light emitting devices 111, 113, and 115 may include a ferromagnetism material, and the first electrode 17 may include a diamagnetism material and/or a paramagnetism material. The second lead electrode 229 facing the second electrode 19 of the light emitting devices 111, 113 and 115 may include a ferromagnetism material and the first lead electrode 227 may be a diamagnetism material or a diamagnetism material and a paramagnetism material.

Here, the material having the ferromagnetism may include nickel (Ni), iron (Fe), and cobalt (Co) when the magnetic field is applied, which is strongly magnetized in the direction of the magnetic field. The material having the paramagnetism may include aluminum (Al), tin (Sn), and platinum (Pt) as a material weakened in the direction of a magnetic field when an external magnetic field is applied. The material having a diamagnetism may be gold (Au), silver (Ag), or copper (Cu), which is magnetized in a direction opposite to the magnetic field when a magnetic field is applied. In the description of the embodiments, the ferromagnetism material may be a ferromagnetism material or may include a material having a ferromagnetism properties, and the diamagnetism material may be a diamagnetic material or may include a material having a diamagnetism properties, and the paramagnetism material may be a paramagnetic material or may include a material having a paramagnetism properties.

Hereinafter, for convenience of explanation, the first light emitting device 111 will be described as a reference, and the second and third light emitting devices 113 and 115 will be described with reference to the description of the first light emitting device 111, and the electrode and the first lead electrode will be described as an example the ferromagnetism material.

In the first light emitting device 111, the first electrode 17 may include a ferromagnetism material, and the second electrode 19 may include a diamagnetism material, or may include at least one of a diamagnetism material and a paramagnetism material. The first electrode 17 includes at least one of nickel (Ni), cobalt (Co), and iron (Fe), and may include nickel or a nickel alloy. The first electrode 17 may include at least three of Ti, Cr, Al, Ni, Sn, In, and Au, for example, at least a ferromagnetism material. The second electrode 19 may include at least one of aluminum (Al), tin (Sn), platinum (Pt), iridium (Ir), aluminum alloy, tin alloy, platinum alloy, iridium alloy, Copper (Cu), a silver alloy, and a copper alloy. The second electrode 19 may be formed without a ferromagnetism material. The second electrode 19 may be formed of, for example, at least two layers or more of Ti, Cr, Al, Cu, Sn, In, and Au. The first and second electrodes 17 and 19 may include a bonding material, for example, at least one of Bi, Cd, and Pb other than tin (Sn) and/or indium (In), or an alloy having them selectively.

The first lead electrode 227 of the substrate 220 may comprise a ferromagnetism material, the second lead electrode 229 includes a diamagnetism material or includes at least one of diamagnetism material and paramagnetism material. The second lead electrode 229 may not include a ferromagnetism material or a layer having a ferromagnetism function. When the second lead electrode 229 is made of only diamagnetism material, it is not affected by the external magnetic force.

If classified as a magnetic pole of the electrodes of the light emitting device and the lead electrodes of the substrate according to the embodiment, the first electrode 17 of the first light emitting device 111 may comprise a first magnetic substance and the first lead electrode 227 of the substrate 220 may comprise a second magnetic substance. The first magnetic substance and the second magnetic substance may have different magnetic poles. If the first magnetic substance may be an N pole, the second magnetic substance may be an S pole, on the contrary if the first magnetic substance may be an S pole and the second magnetic substance may be an N pole.

Referring to FIGS. 2 and 3, an attractive force may be applied between the first electrode 17 of the first light emitting device 111 and the first lead electrode 227 of the substrate 220. The first light emitting device 111 may be closely disposed on the substrate 220 by the attractive force between the first lead electrode 227 and the first electrode 17. At this time, the second electrode 19 of the first light emitting device 111 may be placed on the second lead electrode 229 due to the alignment of the first lead electrode 227 and the first electrode 17. The first electrode 17 and the second electrode 19 of the first light emitting device 111 may be contacted and bonded with the first lead electrode 227 and the second lead electrode 229 of the substrate 220, for example, metal bonded or eutectic bonded.

The plurality of first light emitting devices 111 may be aligned and brought into contact with the lead electrodes 227 and 229 of the substrate 220 in place of one first light emitting device 111 in the above-described manner. The first light emitting devices 111 in the light emitting module 1000 of FIG. 1 are arranged in the respective light emitting units 100 by arranging the one or a plurality of the first light emitting devices 111 on the substrate 220, so that it is not necessary to perform a process of moving and aligning the light emitting devices using separate equipment. The first and second electrodes 17 and 19 of the first light emitting devices 111 are metal-bonded to the first and second lead electrodes 227 and 229 of the substrate 220 without using any solder or wire. The solder process or the wire process for connecting the light emitting devices in the manufacturing process of the light emitting module can be removed. In addition, the second and third light emitting devices 113 and 115 disposed in the light emitting units 100 of the light emitting module of FIG. 1 may be sequentially aligned and bonded using the magnetic material in the above-described manner. Accordingly, all the light emitting devices in the light emitting module and the display device can be mounted in the above-described manner, so that the process and time required for mounting the light emitting devices can be reduced. Accordingly, it is possible to shorten the manufacturing time of a display device using a light emitting device, for example, an LED.

Layer structure of the electrodes of the first light emitting device 111 will be with reference to FIG. 3. Layer structure of the electrodes of the second and third light emitting devices 113 and 115 is to refer to the electrodes of the first light emitting device and may have the same layered structure as that of the electrode of the first light emitting device 111.

FIG. 3 is according to the first embodiment, any one of two electrodes of the light emitting device includes a ferromagnetism material, and the other may be formed without a material having a ferromagnetism, a diamagnetism, or a paramagnetism.

Referring to FIG. 3, the first electrode 17 of the first light emitting device 111 has a structure of at least two layers, and a first layer 171 is an adhesive material or a diffusion barrier material, may include titanium (Ti) or chrome (Cr), and may be formed as a single layer or a multilayer. A second layer 172 includes a ferromagnetism material disposed under the first layer 171, may include at least one of nickel (Ni), iron (Fe), cobalt (Co), and may be formed as a single layer or a multilayer. The second layer 172 may have a thickness of 30 nm or less, when the thickness is less than the above range, there is a problem that a magnetic force is weakened due to the decrease of the surface area, a mutual pulling force is lowered, and the alignment position of the light emitting element is distorted. The second layer 172 may have a multilayer structure including the ferromagnetism material and an adhesive material (e.g., Ti, Cr). A third layer 173 may include gold (Au) as a bonding material and an antioxidant material under the second layer 172, and may be formed as a single layer or a multilayer. The first layer 171 may be removed if the ferromagnetism material that is the second layer 172 functions as an adhesive material. The second electrode 19 of the first light emitting device 111 has at least a two-layer structure and the first layer 191 of the second electrode 19 is an adhesive material or a diffusion barrier material including at least one of titanium (Ti) and chrome (Cr), and may be formed as a single layer or a multilayer. The second layer 192 of the second electrode 19 may include gold (Au) as a bonding material and an antioxidant disposed under the first layer 191 and may be formed as a single layer or a multilayer. The second electrode 19 may not have a layer having a diamagnetism function. The first electrode 17 and the second electrode 19 may be formed of the same number of layers or different numbers of layers. The number of layers of the first electrodes 17 may be greater than the number of layers of the second electrodes 19.

FIG. 4 is a view showing the lead electrodes of the substrate in the first embodiment, and may have a lead electrode that face the electrodes of the light emitting device of FIG. 3.

Referring to FIG. 4, the first lead electrode 227 of the substrate 220 includes a plurality of layer structure, for example, two layers or more layer structure. The first lead electrode 227 of the substrate 220 includes a first to third layers 51, 52 and 53. The first layer 51 of the first lead electrode 227 is disposed on the support layer 221 may include a thermally conductive material or diamagnetic materials, for example, copper (Cu), and may be formed as a single layer or multilayer. An adhesive layer may be further disposed between the first layer 51 of the first lead electrode 227 and the support layer 221, for example, titanium (Ti), or nickel (Ni) may be further disposed. A second layer 52 of the first lead electrode 227 may disposed between the first layer 51 and a third layer 53, may be a ferromagnetism material such as nickel (Ni), and may be formed in a single layer or multilayer. The second layer 52 of the first lead electrode 227 may be contacted on the first layer 51, or my bonded to the first and third layers 51 and 53. The third layer 53 of the first lead electrode 227 is disposed on second layer 52, may include an antioxidant layer, for example, gold (Au), and may be formed in a single layer or multi layer.

The first lead electrode 227 may have a thickness of 30 nm or more when a metal layer having a ferromagnetism material is a single layer. If the thickness of the layer(s) having the ferromagnetism material in the first lead electrode 227 is less than the above range, the magnetic force is weakened due to the decrease of the surface area, the attracting force may be lowered, and there is a problem that an alignment position of the light emitting device may be distorted.

The second lead electrode 229 of the substrate 220 includes a plurality of layer structures, for example, a layer structure of two or more layers, and includes first and second layers 61 and 62. The first layer 61 of the second lead electrode 229 is disposed on the support layer 221 and may include a thermally conductive material or a diamagnetism material such as copper (Cu), and may be formed as a single layer or a multilayer. An adhesive layer may be further disposed between the first layer 61 of the second lead electrode 229 and the support layer 221, for example, titanium (Ti) may be further disposed. The second layer 62 of the second lead electrode 229 is disposed on the first layer 61 and may include gold (Au) as an antioxidant layer and may be formed as a single layer or a multilayer.

As shown in FIG. 5, the bottom surface area A1×B1 of the first electrode 17 of the first light emitting device 111 may be smaller than the area A2×B2 of the top surface of the first lead electrode 227 of the substrate 220. The bottom surface area of the second electrode 19 may be smaller than the top surface area of the second lead electrode 229 of the substrate 220. Accordingly, the first and second electrodes 17 and 19 are bonded within a region of the first and second lead electrodes 227 and 229, so that they do not interfere with each other. An interval D1 between the first and second lead electrodes 227 and 229 may be greater than an interval between the first and second electrodes 17 and 19. A problem of electrical interference between the first and second electrodes 17 and 19 and the other lead electrodes 227 and 229 can be prevented.

Figure 6:
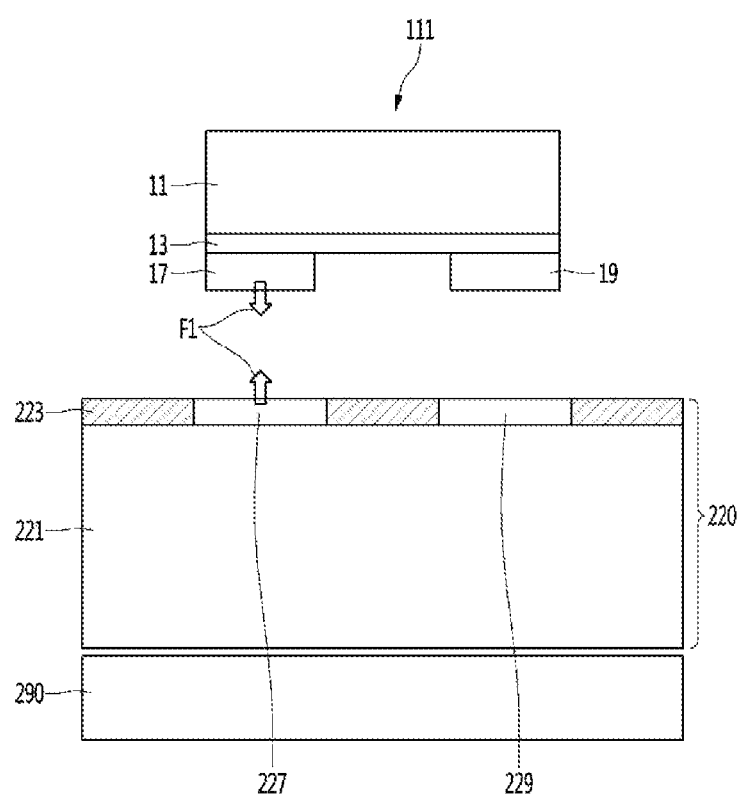
FIGS. 6 to 8 are a view showing an example of a bonding of a substrate and the light emitting device of FIG. 2.
Figure 7:
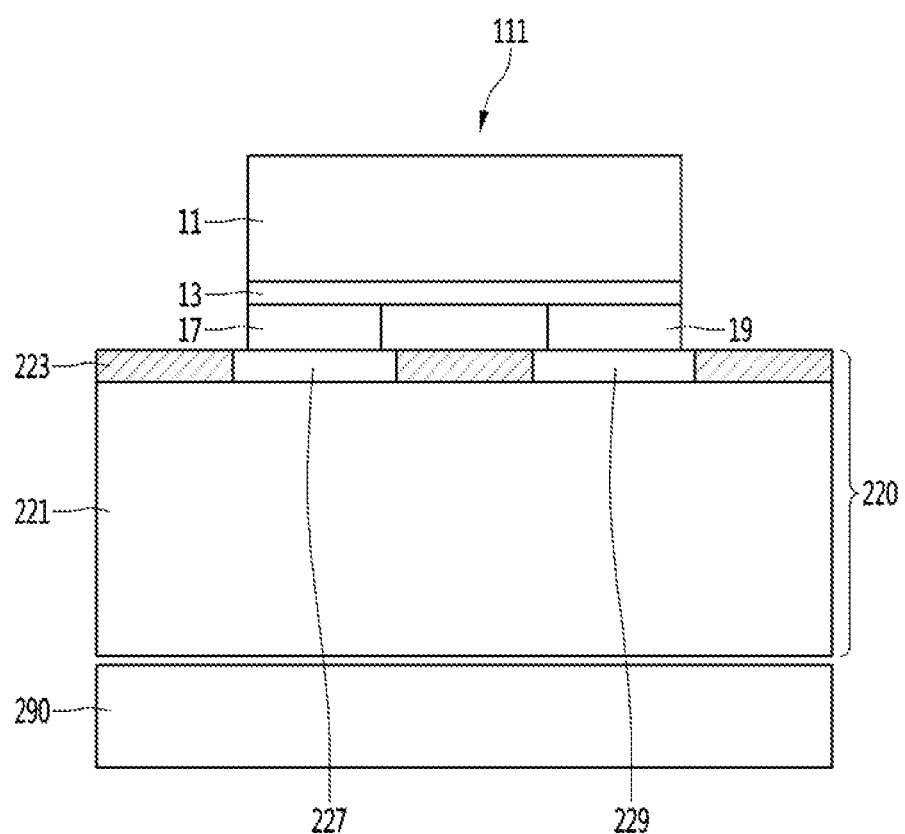
Figure 8:
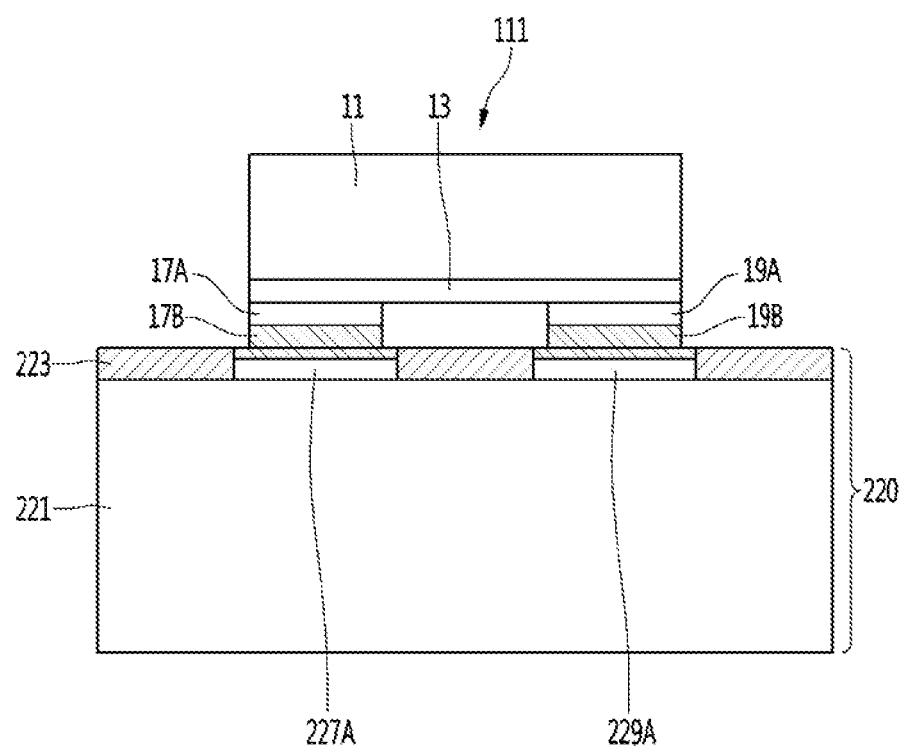

FIGS. 6 to 8 are a diagram illustrating a mounting example of a light emitting module according to an embodiment.

Referring to FIG. 6, the first electrode 17 of the light emitting device 111 has a magnetic force and is magnetized by the ferromagnetism material, and the second electrode 19 may not have a magnetic force. An electromagnet tray 290 may be disposed under a bottom surface of the substrate 220 so that the first light emitting device 111 faces the first and second lead electrodes 227 and 229 on the substrate 220. When the electric current is supplied to the electromagnet tray 290, the first lead electrode 227 of the substrate 220 is magnetized to have a magnetic force by the magnetic force of the electromagnet, and the first lead electrode 227 of the substrate 220 is generated an attraction force F1 to the first electrode 17 of the first light emitting device 111, and the first light emitting device 111 can be aligned on the substrate 220 as shown in FIG. 7. The second electrode 19 of the first light emitting device 111 may be in close contact with the second electrode 19 of the substrate 220. At this time, the first light emitting device 111 can be kept in close contact with the substrate 220 by the coercive force, and in this case, the current supplied to the electromagnet can be cut off.

As shown in FIG. 8, when the first and second electrodes 17 and 19 of the first light emitting device 111 may be arranged to face the first and second lead electrodes 227 and 229 of the substrate 220, the first and second electrodes 17 and 19 of the light emitting device 111 may be metal-bonded to the first and second lead electrodes 227 and 229 of the substrate 220, for example, eutectic bonded.

At this time, the first electrode 17 and the first lead electrode 227 are bonded to each other by a bonding material such as tin (Sn) and a ferromagnetism material in the first electrode 17, and the second electrode 19 and the second lead electrode 229 may be bonded by a bonding material such as tin (Sn). Here, when the metal bonding is in progress, a bonding portion may be generated a first and a second bonding layer 17B and 19B. The first bonding layer 17B may be formed in a mixture of a part material of the first electrode 17A of the first light emitting device 111 and a part material of a first lead electrode 227A of the substrate 220. In addition, a remaining layers which are not mixed with the first electrode 17A may be the first layer 171 in FIG. 3, and a remaining layer that is not mixed with the first lead electrode 227A may exist a part of the first layer 51. The second bonding layer 19B is formed by mixing a part material of the second electrode (19 in FIG. 3) of the first light emitting device 111 and a part material of the second lead electrode 229A of the substrate 220. In addition to, a remaining layers that are not mixed with the second electrode 19A may be the first layer 191 in FIG. 3 and a remaining layer that is not mixed with the second lead electrode 229A may remain a part of the first layer 191 in FIG. 4. The first bonding layer 17B may include at least an alloy of a ferromagnetism material and a bonding layer, and the second bonding layer 19B may include an alloy of a diamagnetism material and a bonding layer. Due to the metal bonding process, an adhesion force between the first light emitting device 111 and the substrate 220 is high, and the electrical conductivity and thermal conductivity can be improved.

In the first bonding layer 17B being adjoining layer, at least one or an alloy having these optionally of tin, indium, bismuth agent (Bi), cadmium (Cd), lead (Pb) as a bonding layer may be mixed with the ferromagnetism material. In the second bonding layer 19B, at least one or an alloy having these optionally of tin, indium, bismuth (Bi), cadmium (Cd), lead (Pb) as a bonding layer may be mixed with the diamagnetism material.

Figure 9:
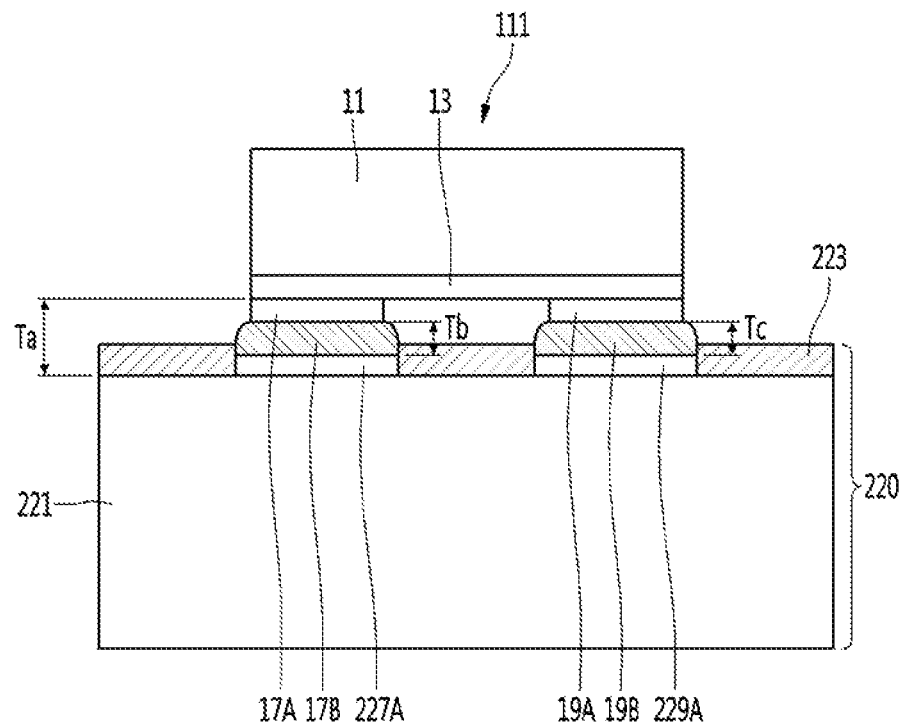
FIG. 9 is a cross-sectional view showing a specific example of an electrode and a lead electrode after the bonding of the light emitting device and the substrate of FIG. 8.

As shown in FIG. 9, the first electrode 17A of the first light emitting device 111 and the first lead electrode 227A of and the substrate 220 may be electrically connected to and bonded to each other by the first bonding layer 17B. A thickness Tb of the first bonding layer 17B may be thicker than a thickness of the first electrode 17A or the first lead electrodes 227A. The thickness Tb of the first bonding layer may be 40% or more of a sum Ta of a thicknesses the first bonding layer 17B, the first electrode 17A and the first lead electrode 227A, for example, 45% or more. When the thickness Tb of the first bonding layer 17B is less than 40% of the sum thickness Ta, the bonding efficiency may be lowered and the electrical conduction and heat conduction characteristics may be decreased.

The second electrode 19A of the first light emitting device 111 and the second lead electrode 229A of the substrate 220 may be electrically connected to and bonded to each other by the second bonding layer 19B. The thickness Tb of the second bonding layer 19B may be thicker than the thickness of the second electrode 19A or the second lead electrode 229A. The thickness Tb of the second bonding layer 19B may be 40% or more of the sum Ta of thicknesses of the second bonding layer 19B, the second electrode 19A and the second lead electrode 229A, for example, 45% or more. When the thickness Tb of the second bonding layer 19B is less than 40% of the sum thickness Ta, the bonding efficiency may be lowered and the electrical conduction and heat conduction characteristics may be decreased. The first lead electrode 227A and the first bonding layer 17B of the substrate 220 may have a thickness ratio of 1:1 to 1:3.5, and the second lead electrode 229A and the second bonding layer 17B may have a thickness ration of 1:1 to 1:3.5. By having the above-mentioned ratios of the first and second bonding layers 17B and 19B, the thermal conductivity and the electric conductivity by the magnetic materials can be improved.

The embodiment may include a photosensitive paste between the electrode of the light emitting device and the lead electrode of the substrate, but is not limited thereto.

Figure 10:
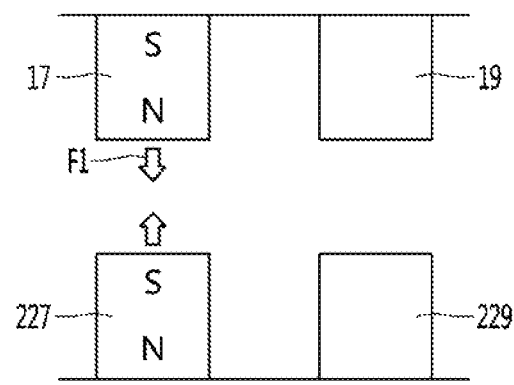
FIG. 10 is a view for explaining the magnetism of the lead electrodes of the electrode and the substrate of the light emitting device according to an embodiment.

Here, as shown in FIG. 10, as shown in FIG. 10, the first lead electrode 227 of the substrate 220 and the first electrode 17 of the first light emitting device 111 may be magnetic poles of mutually opposite magnetic poles facing each other, and may be S pole (or N pole) and N pole (or S pole). The first lead electrode 227 of the substrate 220 and the first electrode 17 of the first light emitting device 111 can be applied to attractive force F1 to each other at a portion facing each other.

Figure 11:
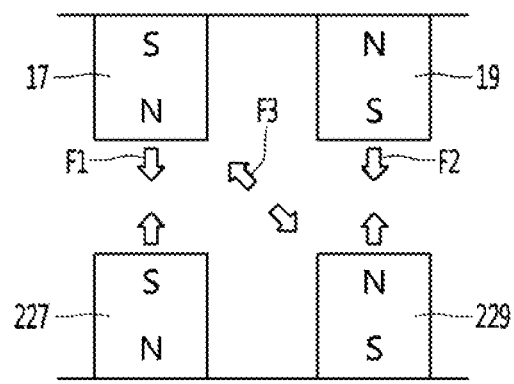
FIG. 11 is another example of FIG. 10, which explains the magnetism of the lead electrodes of the electrode and the substrate of the light emitting device.

As another example, as shown in FIG. 11, a first electrode 17 of the lead electrode 227 and the first light emitting device 111 of the substrate 220 to form a magnetic pole opposite to each other facing each other, and the second lead electrode 229 of the substrate 220 and the second electrode 19 of the first light emitting device 111 are made to have mutually different magnetic poles, but the first electrode and the first lead electrode 227 may be formed in opposite poles from each other. As a result, the first lead electrode 227 of the substrate 220 and the first electrode 17 of the first light emitting device 111 may be acted to attractive force F1 in an area where they face each other, and the second lead electrode 229 of the substrate 220 and the second electrode 19 of the first light emitting device 111 may be acted to an attractive force F2 in an area where they face each other and may be acted to a repulsive force F3 to the other electrode. That is, each of the first and second electrodes 17 and 19 and first and second lead electrodes 227 and 229 may be formed to add the ferromagnetism material, and so that the attractive force acts to each other to form the opposite magnetic poles, and adjacent electrodes and the lead electrodes may be to have a repulsive force F3. Accordingly, even if the anode terminal and the cathode terminal of the first light emitting device 111 are not distinguished from each other, they can be distinguished by the same each other and a different magnetic poles.

Figure 12:
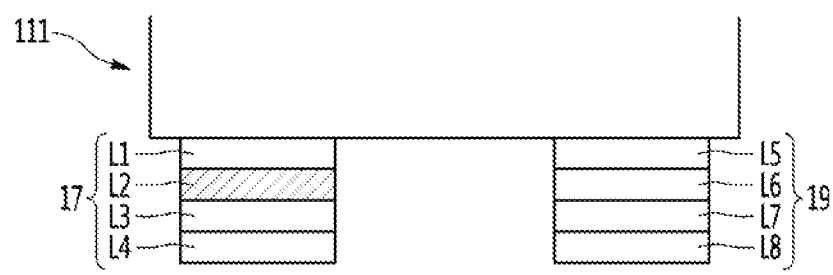
FIG. 12 is a view showing an example of the electrode of the light emitting device as a second embodiment.

FIG. 12 shows a second embodiment, which may provide with a first electrode 17 of the light emitting device having a ferromagnetism material and a second electrode 19 having a diamagnetism material. Configuration of the first and second electrodes of the second and third light emitting devices may be selectively applied to the configuration of the first and second electrodes of the first light emitting device disclosed in FIG. 12.

Referring to 12, the first electrode 17 of the first light emitting device 111 may include at least a four-layer structure, a first layer L1 is an adhesive material or a diffusion barrier material and may include chromium (Cr), a second layer L2 includes a ferromagnetism material under the first layer L1, a third layer L3 is a bonding material under the second layer L2 and includes a tin or indium, and the fourth layer 4 L4 may be an antioxidant material under the third layer L3 and may include a gold (Au). The second electrode 19 of the light emitting device 111 may include at least a four-layer structure, a first layer L5 is an adhesive material or a diffusion barrier material and may include chromium (Cr), a second layer L6 include a diamagnetism material under the first layer L5, a third layer L7 is a bonding material under the second layer L6 and may include a tin or indium, and a fourth layer L8 may be an antioxidant material under the third layer L7 and include a gold (Au). The second electrode 19 may not form the diamagnetic material, but is not limited thereto. The first electrode 17 and second electrode 19 may be formed of the same number of layers.

Figure 13:
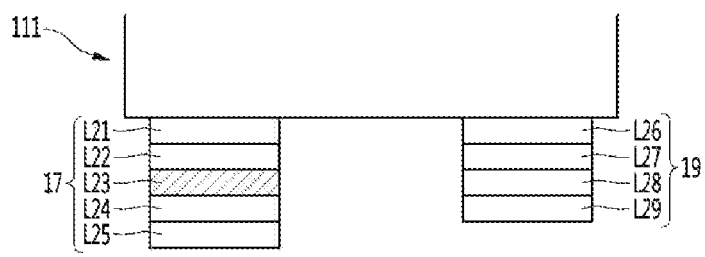
FIG. 13 is a view showing an example of the electrode of the light emitting device as a third embodiment.

FIG. 13 shows a third embodiment in which the first electrode 17 of the light emitting device has a ferromagnetism material and the second electrode 19 does not have a layer functioning as a diamagnetism material and may have a layer of a diffusion barrier function. Configuration of the first and second electrodes of the second and third light emitting devices may be selectively applied to the configuration of the first and second electrodes of the first light emitting device disclosed in FIG. 13.

Referring to FIG. 13, the first electrode 17 of the first light emitting device 111 may be at least a five-layer structure, a first layer L21 may be an adhesive material and may include a titanium (Ti), a second layer L22 may be a diffusion barrier material under the first layer L21 and may include aluminum (Al), a third layer L23 comprises a ferromagnetism material under the second layer L22, a fourth layer L24 may be a bonding material under the third layer L23 and may include a tin or indium, and a fifth layer L25 may be an antioxidant material under the fourth layer L24 and may include a gold (Au). The second electrode 19 of the light emitting device 111 may be at least four-layer structure, a first layer L26 may be an adhesive material and may include a titanium (Ti), a second layer L27 be a diffusion barrier material under the first layer L26 and may include an aluminum (Al), a third layer L28 may be a bonding material under the second layer L27 and may include a tin or indium, and a fourth layer L29 may be an antioxidant material under the third layer L28 and may include a gold (Au). The second electrode 19 may not form the diamagnetism material, but is not limited thereto. The first electrode 17 and second electrode 19 may be formed of a different number of layers.

Figure 14:
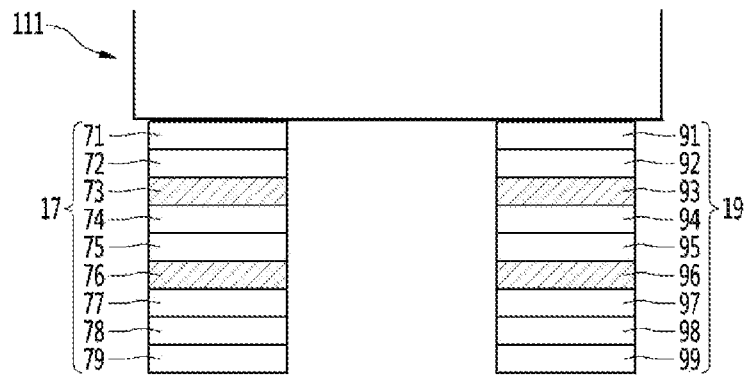
FIG. 14 is a view showing an example of the electrode of the light emitting device as a fourth embodiment.

FIG. 14 shows a fourth embodiment in which the first electrode 17 of the light emitting device 111 may have a layers having a ferromagnetism material arranged in a plurality, the second electrode 19 may have a layer having a diamagnetism material. Configuration of the first and second electrodes of the second and third light emitting devices may be selectively applied to the configuration of the first and second electrodes of the first light emitting device disclosed in FIG. 14.

Referring to FIG. 14, a first electrode 17 of the light emitting device 111 has a multilayer structure, the multilayer structure has at least three layers, for example, may include a first layer to ninth layer 71 to 79. The first layer 71 is a layer adjacent to or in contact with the first light emitting structure 13, and may be an adhesive layer, for example, may include a titanium (Ti) or alloys thereof. The second layer 72 is disposed under the first layer 71, may be a diffusion barrier, for example, may include aluminum (Al) or an alloy thereof. The third layer 73 is disposed between second layer 72 and fourth layer 74 and may be a ferromagnetism material, for example, may include nickel (Ni). The fourth layer 74 may be an adhesive layer to adhere between the second layer 72 and fifth layer 75, for example, may include titanium (Ti) or alloys thereof. The fifth layer 75 may be include a diffusion barrier under the fourth layer 74, for example, may include aluminum (Al) or an alloy thereof. The sixth layer 76 is disposed between the fifth layer 75 and seventh layer 77 and may be a layer ferromagnetism material, for example, may include nickel (Ni). The seventh layer 77 may be an adhesive layer that was adhered to the sixth layer 76 and eighth layer 78, for example, may include titanium (Ti). The eighth layer 78 may be a bonding layer between the seventh layer 77 and ninth layer 79, for example, tin (Sn) and/or indium (In). The ninth layer 79 is disposed under the eighth layer 78 and may be an antioxidant layer, for example, gold (Au).

The first electrode 17 according to the embodiment may have two or more metal layers 73 and 76 having the ferromagnetism material and may be spaced apart from each other. The metal layers 73 and 76 having the ferromagnetism material in the first electrode 17 may be disposed between the adhesive layer and the antioxidant layer, or between the diffusion barrier layer and the bonding layer.

The first electrode 17 may be disposed alternately with the adhesive layer when the metal layers 73 and 76 having the ferromagnetism material are multi-layered. The first electrode 17 may be disposed alternately with the diffusion barrier layer when the metal layers 73 and 76 having the ferromagnetism material are multilayered.

When the metal layers 73 and 76 having the ferromagnetism material is a multilayer in the first electrode 17, and each layer is 5 nm or more and the total thickness of the plurality of layers may be greater than or equal to 30 nm. As another example, the first electrode 17, when the metal layer having the ferromagnetism material is a single layer, may be formed to a thickness more than 30 nm. If the thickness of the layer(s) having the ferromagnetism material in the first electrode 17 is less than the above range, the magnetic force is weakened due to the decrease of the surface area, the mutual attracting force may be lowered, and there is a problem that the alignment position of the light emitting device may be distorted.

The second electrode 19 of the first light emitting device 111 has a multilayer structure, and the multilayer structure may include there layers or more, for example, may include a first layer to ninth layer 91 to 99. The first layer 91 is a layer adjacent to or in contact with the first light emitting structure and may be an adhesive layer, for example, may include a titanium (Ti) or alloys thereof. The second layer 92 is disposed under the first layer 91 and may be a diffusion barrier layer, for example, may include aluminum (Al) or an alloy thereof. The third layer 93 is disposed between second layer 92 and fourth layer 94 and may be an adhesive layer, for example, may include a titanium (Ti). The fourth layer 94 may be a diffusion barrier layer disposed between the third layer 93 and fifth layer 95, for example, may include aluminum (Al) or an alloy thereof. The fifth layer 95 may be an adhesive layer between the fourth layer 94 and sixth layer 96, for example, may include a titanium (Ti). The sixth layer 96 may comprise a diamagnetism material or a thermally conductive material, for example, may include copper (Cu) or copper alloy. The seventh layer 97 may be an adhesive layer for adhering the six layer 96 and eighth layer 98, the eighth layer 98 may be a bonding layer under the seventh layer 97, for example, may include tin (Sn) and/or the indium, and the ninth layer 99 may be an antioxidant layer under the eighth layer 98, for example, may be gold (Au).

In the first electrode 17, the sixth layer 96 which is a metal layer having the ferromagnetism material may be disposed between the bonding layer 98 and the diffusion barrier layer 94. As another example, the second electrode 19 may be a laminated structure such as Ti/Al/Cu/Sn (In)/Au. As another example, the second electrode 19 may not include a diamagnetism material, for example, may not include the sixth layer 96 or copper (Cu).

The thickness of the bonding layers 78 and 98 in the first and second electrodes 17 and 19 may be arranged to be thicker than the other layers, for example, it is formed 1 μm or more, and a bonding efficiency with the different layers or the lead electrode may be improved.

Figure 15:
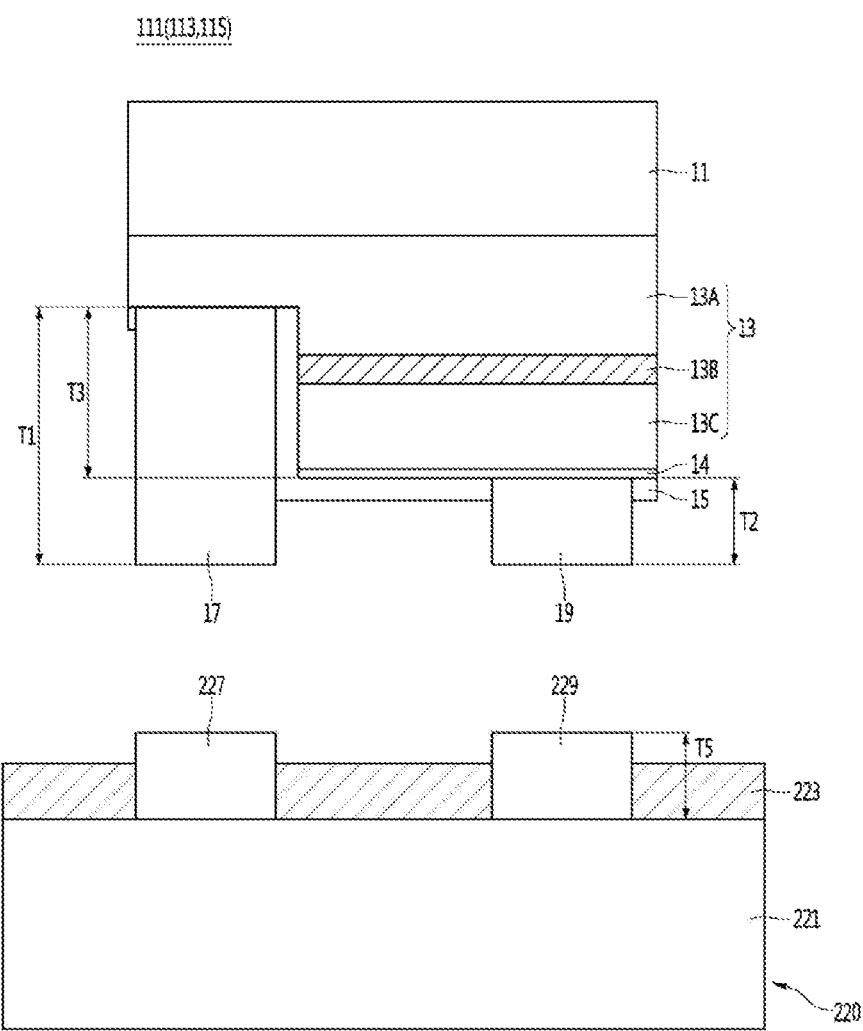
FIG. 15 is a comparison view showing the mounting example according to the thickness difference between the electrodes of the light emitting device in the light emitting module according to the embodiment.

FIG. 15 is a view for illustrating an example of a bonding to the substrate 220 as a first example of a light emitting device according to the embodiment.

Referring to FIG. 15, the light emitting devices 111, 113 and 115 is, for example, an LED chip may emit light of blue, green, or red. For the embodiment of convenience, will be described as a blue LED chip or a green LED chip. The first light emitting device 111 includes a light transmitting substrate 11 and a light emitting structures 13, the light emitting structure 13 is the first conductive type semiconductor layer 13A, an active layer 13B disposed under the first conductive type semiconductor layer 13A, and a second conductive type semiconductor layer 13C disposed under the active layer 13B. There may be further disposed to the other semiconductor layers on and/or under the active layer 13B, but is not limited thereto.

The light transmitting substrate 11 is, for example, a light-transmissive, a conductive substrate or an insulating substrate. The top surface and/or lower surface of the light transmitting substrate 11 has a plurality of protrusions (not shown) may be formed, and each of the plurality of protrusions includes at least one of a hemispherical shape, a polygonal shape, or an elliptical shape in a side cross-section, and the protrusions may be arranged in a stripe shape or a matrix shape. The protrusions may be improved light extraction efficiency. Other semiconductor layer may be disposed the light transmitting substrate 11 and the first conductivity type semiconductor layer 13A, for example, a buffer layer (not shown), but is not limited thereto. The light transmitting substrate 11 may be removed.

The first conductive type semiconductor layer 13A may be disposed between the light transmitting substrate 11 and the active layer 13B. The first conductive type semiconductor layer 13A may be implemented in at least one of a compound semiconductor of group III-V and group II-VI which a dopant of first conductivity type is doped. The first conductive type semiconductor layer 13A may be formed, for example, a semiconductor material having a composition formula of $In_xAl_yGa_{1-x-y}N$ ($0 \leq x \leq 1$, $0 \leq y \leq 1$, $0 \leq x+y \leq 1$). The first conductive type semiconductor layer 13A, for example, may include at least one of GaN, AlN, AlGaN, InGaN, InN, InAlGaN, AlInN, AlGaAs, GaP, GaAs, GaAsP, or AlGaInP. The first conductive type semiconductor layer 13A may be a n-type semiconductor layer doped with a n-type dopant such as Si, Ge, Sn, Se, or Te. The first conductive type semiconductor layer 13A may be arranged in a single layer or multiple layers. The first conductive type semiconductor layer 13A may be formed of a superlattice structure which is disposed in at least two different layers are alternately. The first conductive type semiconductor layer 13A may be a contact electrode layer.

The active layer 13B may be formed in at least one of a single wells, single quantum well, a multi-well, a multiple quantum well (MQW) structure, quantum wire, or a quantum dot structure. The active layer 13B has a hole (or electrons) injected through the second conductive type semiconductor layer 13C and the electron (or hole) injected through the first conductive type semiconductor layer 13A to couple each other, wherein is a layer which emits light by a band gap difference in the energy band of the forming material of the active layer 13B. The active layer 13B may be implemented with compound semiconductors. The active layer 13B, as an example, may be implemented at least in one of a compound semiconductor of a group II-VI and group III-V. If the active layer 13B is implemented as a multi-well structure, the active layer 13B comprises a plurality of well layers and a plurality of barrier layers arranged alternately, a pair of the well layer/the barrier layer is formed in a period from 2 to 30. Period of the well layer/barrier layer include, for example, at least one of pairs of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, or InP/GaAs. The well layer may be disposed of, for example, a semiconductor material having a composition formula of $In_xAl_yGa_{1-x-y}N$ ($0 \leq x \leq 1$, $0 \leq y \leq 1$, $0 \leq x+y \leq 1$). The barrier layer may be formed of, for example, a semiconductor material having a composition formula of $In_xAl_yGa_{1-x-y}N$ ($0 \leq x \leq 1$, $0 \leq y \leq 1$, $0 \leq x+y \leq 1$).

The second conductive type semiconductor layer 13C may be formed of, for example, a semiconductor material having a composition formula of $In_xAl_yGa_{1-x-y}N$ ($0 \leq x \leq 1$, $0 \leq y \leq 1$, $0 \leq x+y \leq 1$). The second conductive type semiconductor layer 13C may be include, for example, at least one of GaN, AlN, AlGaN, InGaN, InN, InAlGaN, AlInN, AlGaAs, GaP, GaAs, GaAsP, or AlGaInP, and may be a p-type semiconductor layer with doped p-type dopant. The second conductive type semiconductor layer 13C may be arranged in a single layer or multiple layers. The second conductive type semiconductor layer 13C may be formed of a superlattice structure which is disposed in at least two different layers are alternately. The second conductive type semiconductor layer 13C may be a contact electrode layer.

The light emitting structure 13 may include from the first conductivity type semiconductor layer 13A to the second conductivity type semiconductor layer 13C. As another example, the light emitting structure 13 may be implemented to any one of structures of an n-p junction structure, a p-n junction structure, an n-p-n junction structure, or the p-n-p junction structure.

The first electrode 17 of the first light emitting device 111 is in contact with the first conductive type semiconductor layer 13A and may be electrically connected to the first conductive type semiconductor layer 13A, and the second electrode 19 is in contact with the second conductive type semiconductor layer 13C and may be electrically connected to the second conductive type semiconductor layer 13C.

The first electrode 17 may be disposed on the first conductive type semiconductor layer 13A, and the second electrode 19 may be disposed on the second conductive type semiconductor layer 13C. The first electrode 17 and the second electrode 19 may be further included a current diffusion pattern of the arm structure or a finger structure. The first electrode 17 and the second electrode 19 may be formed of a non-transmissive metal having the characteristics of ohmic contact, an adhesive layer, a bonding layer, but is not limited thereto. The first electrode 17 comprises the ferromagnetism material, the second electrode 19 may comprise the diamagnetism material or the paramagnetism material.

The electrode layer 14 is disposed between the second electrode 19 and the second conductive type semiconductor layer 13C, and the electrode layer 14 may be formed of a single layer or a multilayer including a reflective material that reflects more than 70% of the light, for example, may be formed of a metal or metal oxide. The electrode layer 14 may be selectively formed of Al, Ag, Pd, Rh, Pt, or Ir. The electrode layer 14 may include a stack structure of contact layer/reflection layer, for example, may include a stack structure of at least one layer of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ZnO, IrOx, RuOx, and NiO, and at least one layer of Al, Ag, Pd, Rh, Pt, and Ir.

An insulating layer 15 may be disposed under the electrode layer 14. The insulating layer 15 may be disposed on the upper surface of the electrode layer 14 and the side surface of the semiconductor layer and may be selectively in contact with the first and second electrodes 17 and 19. The insulating layer 15 includes an insulating material or an insulating resin formed of at least one of oxides, nitrides, fluorides, and sulfides having at least one of Al, Cr, Si, Ti, Zn and Zr. The insulating layer 15 may be selectively formed of, for example, $SiO_2$, $Si_3N_4$, $Al_2O_3$, and $TiO_2$. The insulating layer 15 may be formed as a single layer or a multilayer, but is not limited thereto.

A thickness T1 of the first electrode 17 according to the embodiment may be greater than a thickness T2 of the second electrode 19 and a thickness difference T3 may be equal to or less than 2 μm, for example, in a range of 0.3 μm to 2 μm. If the thickness difference T3 between the first and second electrodes 17 and 19 is smaller than the above range, the bonding efficiency at the bonding process with the lead electrodes 227 and 229 of the substrate 220 may be lowered. A depth of the mesa etching may be deepened and the first conductive type semiconductor layer 13A may be damaged. At this time, the first and second lead electrodes 227 and 229 of the substrate 220 may have the same thickness T5.

FIG. 16 is a view showing an example according to the thickness difference between the bonding lead electrodes of the substrate 220. Referring to FIG. 16, when a thicknesses (T1=T2) of the first and second electrodes 17 and 19 of the light emitting devices 111, 113 and 115 are the same, a thickness T4 of the first lead electrode 227 of the substrate 220 is larger than the thickness T5 of the second lead electrode 229. As the thickness T4 of the first lead electrode 227 increases, the height of the top surface of the first lead electrode 227 becomes high. Therefore, bonding positions of the first and second electrodes 17 and 19 of the first light emitting device 111 may be different from each other. Here, the first lead electrode 227 may increase the thickness of the ferromagnetism material to, for example, 500 nm or more. At this time, the protective layer 223 of the substrate 220 may be positioned lower than the upper surfaces of the first and second lead electrodes 227 and 229.

Figure 17:
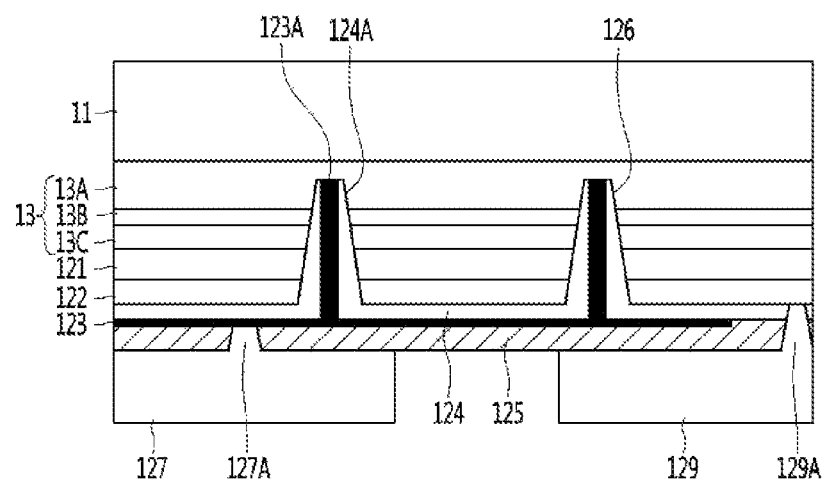
FIG. 17 is a view showing a first modification of the light emitting device according to an embodiment.

FIG. 17 is a first modification of the light emitting device according to the embodiment, prepetition description of the same configuration and the same number in FIG. 15 will be omitted.

Referring to FIG. 17, the light emitting device includes a light transmitting substrate 11, a light emitting structure 13, a first electrode 127 and second electrode 129. The light transmitting substrate 11 and the light emitting structures 13 will be referred with reference to the description of FIG. 15.

The first and second electrodes 127 and 129 is disposed under the light emitting structure 13. The first electrode 127 has a ferromagnetism material and is electrically connected to the first conductive type semiconductor layer 13A, and the second electrode 129 has a diamagnetism material and/or paramagnetism material and is electrically connected to the second conductive type semiconductor layer 13C. The first and second electrodes 127 and 129 may have a bottom shape of a polygon or a circular shape.

The light emitting device includes a first and second electrode layers 121 and 122, the third electrode layer 123, an insulating layer 124 and 125. The first and second electrode layers 121 and 122 each may be formed as a single layer or multiple layers, and may serve as a current diffusion layer. The first and second electrode layers 121 and 122 are the first electrode layer 121 disposed under the light emitting structure 13 and a second electrode layer 122 disposed under the first electrode layer 121. The first electrode layer 121 spreads a current, the second electrode layer 122 reflects the incident light.

The first and second electrode layers 121 and 122 may be formed of different materials. The first electrode layer 121 may be formed of a transmitting material, for example, a metal oxide and a metal nitride. The first electrode layer 121 may be selectively formed of, for example, ITO (indium tin oxide), ITON (ITO nitride), IZO (indium zinc oxide), IZON (IZO nitride), IZTO (indium zinc tin oxide), IAZO (indium aluminum zinc oxide) from, IGZO (indium gallium zinc oxide), IGTO (indium gallium tin oxide), AZO (aluminum zinc oxide), ATO (antimony tin oxide), GZO (gallium zinc oxide). The second electrode layer 122 is in contact with the lower surface of the first electrode layer 121 and may serve as a reflective electrode layer. The second electrode layer 122 comprises a metal, for example, Ag, Au or Al. When a part region of the first electrode layer 121 is removed, the second electrode layer 122 may be in partial contact with the lower surface of the second conductive type semiconductor layer 13C.

As another example, a structure of the first and second electrode layers 121 and 122 may be laminated in a structure of an Omni-directional reflector (ODR) layer. The structure of an Omni-directional reflector layer may be formed of a stacked structure of the first electrode layer 121 having a lower refractive index and the second electrode layer 122 that is a metal of a highly reflective material and contacts the first electrode layer 121. The electrode layers 121 and 122 may be formed of, for example, a stacked structure of ITO/Ag. The total reflection angle at the interface between the first electrode layer 121 and the second electrode layer 122 can be improved.

As another example, the second electrode layer 122 may be removed and may be a reflective layer formed of a different material. The reflective layer may be formed of a distributed Bragg reflector (DBR) structure, and the DBR structure includes a structure in which two dielectric layers having different refractive indices are alternately arranged, and may each include, for example, any one of $SiO_2$ layer, $Si_3N_4$ layer, $TiO_2$ layer, $Al_2O_3$ layer, and MgO layer. As another example, the electrode layers 121 and 122 may include all of the DBR structure and the ODR structure, in which case it is possible to provide a light emitting chip having a light reflectance of 98% or more. Since the light reflected from the second electrode layer 122 is emitted through the light transmitting substrate 11, the light emitting chip mounted in the flip-type can emit most of the light in the vertical direction.

The third electrode layer 123 is disposed under the second electrode layer 122 and is electrically insulated from the first and second electrode layer 121 and 122. The third electrode layer 123 may include a metal, for example, at least one of titanium (Ti), copper (Cu), nickel (Ni), gold (Au), chrome (Cr), tantalum (Ta), platinum (Pt), tin (Sn), Silver (Ag), phosphorus (P). The first electrode 127 and second electrode 129 is disposed and the third electrode layer 123.

The insulating layer 124 and 125 are insulated from unwanted contact between the layers of the first and second electrode layers 121 and 122, the third electrode layer 123, the first and second electrodes 127 and 129, and the light emitting structure 13. The insulating layer 124 and 125 comprises first and second insulating layers 124 and 135. The first insulating layer 124 is disposed between the third electrode layer 123 and the second electrode layer 122. The second insulating layer 125 is disposed between the third electrode layer 123 and the first and second electrodes 127 and 129.

The third electrode layer 123 is connected to the first conductive type semiconductor layer 13A. A first connecting portion 123A of the third electrode layer 123 is projected to the via structure from a lower portion of the first and second electrode layers 121 and 122 and the light emitting structure 13 and is in contact with the first conductive type semiconductor layer 13A. The connecting portion 123A may be disposed in plurality. A portion 124A of the first insulating layer 124 is extended on a periphery region of the connecting portion 123A of the third electrode layer 123 and is blocked to connect electrically among the third electrode layer 123, the first and second electrode layers 121 and 122, the second conductive type semiconductor layer 13C and an active layer 13B. The insulating layer may be disposed to the side surface protection on the side of the light emitting structure 13, but is not limited thereto.

The second electrode 129 is disposed under the second insulating layer 125 and is contacted or connected with at least one of the first and second electrode layers 121 and 122 through an open region of the second insulating layer 125. The first electrode 127 is disposed under the second insulating layer 125 and is connected to the third electrode layer 123 through an open region of the second insulating layer 125. Accordingly, a protrusion 129A of the second electrode 129 is electrically connected to the second conductive type semiconductor layer 13C through the first and second electrode layers 121 and 122, and a protrusions 127A of the first electrode 127 is electrically connected to the first conductive type semiconductor layer 13A through the third electrode layer 123.

A plurality of connection portions 123A connected to the first electrode 127 may be disposed to improve current diffusion. The first and second electrodes 127 and 129 may be provided under the light emitting structure 13 in a wide area. The lower surfaces of the first and second electrodes 127 and 129 may be disposed on the same horizontal surface, and the bonding efficiency with the lead electrodes of the substrate 220 can be improved. The ferromagnetism material according to the embodiment may be disposed under the protrusion 127A of the first electrode 127.

Figure 18:
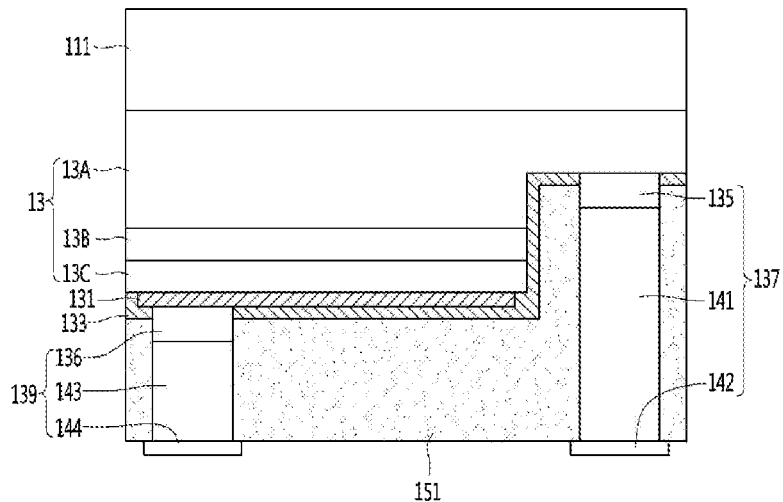
FIG. 18 is a view showing a second modification of the light emitting device according to an embodiment.
Figure 19:
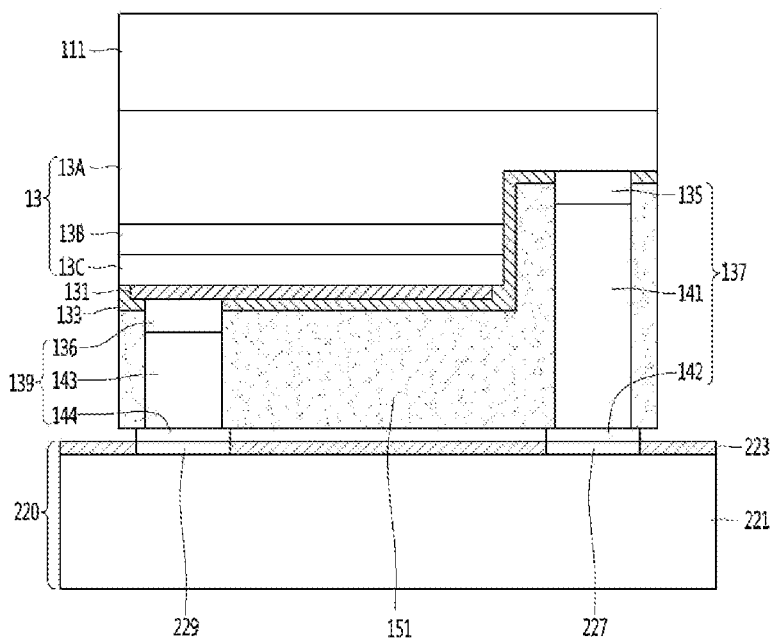
FIG. 19 is an example of a light emitting module mounted on the substrate the light emitting device of FIG. 18.

FIGS. 18 and 19 are a second modification of the light emitting device. As described in the second modification, it disclosed in the above configuration and the same parts will be given with reference to the above description.

Referring to FIGS. 18 and 19, the light emitting device includes a light transmitting substrate 11, a light emitting structure 13, the electrode layer 131, and the insulating layer 133. A material of the electrode layer 131 and the insulating layer 133 will be given with reference to the above description.

The light emitting device includes the first electrode 137 and the second electrode 139 under the light emitting structure 13. The first electrode 137 includes a first contact layer 135, a first connection layer 141, and first a bonding layer 142, and the first contact layer 135 contacts the first conductivity type semiconductor layer 13A. The first connection layer 141 is connected between the first contact layer 135 and the first bonding layer 142. The ferromagnetism material according to the embodiment may be disposed on at least one or both of the first connection layer 141 and the first bonding layer 142. The first connection layer 141 and the first bonding layer 142 may be disposed in a multi-layer structure. The first contact layer 135 includes at least one of a Cr, Ti, Ta and a selective alloy thereof, the first connection layer 141 includes at least two of Al, Ti, Fe, Ni, and a selective alloy thereof, and the first bonding layer 142 may include at least two of In, Sn, Ni, Au and a selective alloy thereof.

The second electrode 139 include a second contact layer 136, a second connection layer 143, and the second bonding layer 144, and the second contact layer 136 contacts the second conductive type semiconductor layer 13C and the second connection layer 143 is connected between the second contact layer 136 and the second bonding layer 144. The diamagnetism material or the paramagnetism material according to the embodiment may be disposed on at least one or all of the second connection layer 143 and the second bonding layer 144 or may be removed on at least one or all of the second connection layer 143 and the second bonding layer 144. The second contact layer 136, the second connection layer 143 and the second bonding layer 144 may be disposed in a single layer or multi-layer structure. The second contact layer 136 includes at least one of Cr, Ti, Ta and a selective alloy thereof, the second connection layer 143 includes at least two of Al, Ti, Cu, Ag, Pt, and a selective alloy thereof, the first bonding layer 144 may include at least two of In, Sn, Cu, Au and a selective alloy thereof.

The light emitting device may include a support member 151 disposed under the light emitting structure 13. The support member 151 is formed of an insulating material, it the insulating material is formed of a resin layer, such as for example, silicone or epoxy. As another example, the insulating material may include a paste or an insulating ink. A type of the material of the insulating material is formed of a resin of alone or in combination of polyacrylate resin, epoxy resin, phenolic resin, polyamides resin, polyimides rein, unsaturated polyesters resin, polyphenylene ether resin (PPE), polyphenilene oxide resin (PPO), polyphenylenesulfides resin, cyanate ester resin, benzocyclobutene (BCB), Polyamido-amine Dendrimers (PAMAM), and Polypropylene-imine, Dendrimers (PPI), and PAMAM internal structure and a PAMAM-OS (organosilicon) having an organic-silicon external surface.

The support member 151 includes at least one of compounds such as oxides, nitrides, fluorides, and sulfides, having Al, Cr, Si, Ti, Zn, and Zr therein. Here, the compound added in the support member 151 is a heat diffusion agent, and the heat diffusion agent may be used as powder particles having a predetermined size, grain, filler, additives, and for the convenience of the following description, the heat diffusion agent will be described. The heat diffusion agent comprises a ceramic material, and the ceramic material includes at least one of low-temperature co-fired ceramic (LTCC), high temperature co-fired ceramic (HTCC), alumina, quartz, calcium zirconate, forsterite, SiC, graphite, fusedsilica, mullite, cordierite, zirconia, beryllia, and aluminum nitride. The ceramic material includes, for example, at least one of $SiO_2$, $Si_xO_y$, $Si_3N_4$, $Si_xN_y$, $SiO_xN_y$, $Al_2O_3$, BN, $Si_3N_4$, SiC (SiC—BeO), BeO, CeO, and a ceramic such as AlN. The thermally conductive material may comprise a component of the C (diamond, CNT).

The support member 151 may be formed of a single layer or a multiple layer, but is not limited thereto. When the support member 151 contains a powder of the ceramic material, a strength of the support member 151 is improved, and may be also improved thermal conductivity. The thickness of the support member 151 may be 2 μm or more, it may be minimal improvements of the support and thermal properties of the member 151 when formed into a less 2 μm.

As shown in FIG. 19, the first bonding layer 142 of the first electrode 137 and the second bonding layer 144 of the second electrode 149 may be protruded in a lower surface of the support member 151. For example, the first and second bonding layers 142 and 144 has a bottom width greater than a width of the first and second connection layers and is disposed to face the first and second lead electrodes 227 and 229 of the substrate 220. Accordingly, the first bonding layer 142 of the first electrode 127 with the ferromagnetism material may be metal-bonded to the first lead electrode 227 having the ferromagnetism material of the substrate 220.

Here, the support member 151 may be spaced apart from the protective layer 223 of the substrate 220.

Figure 20:
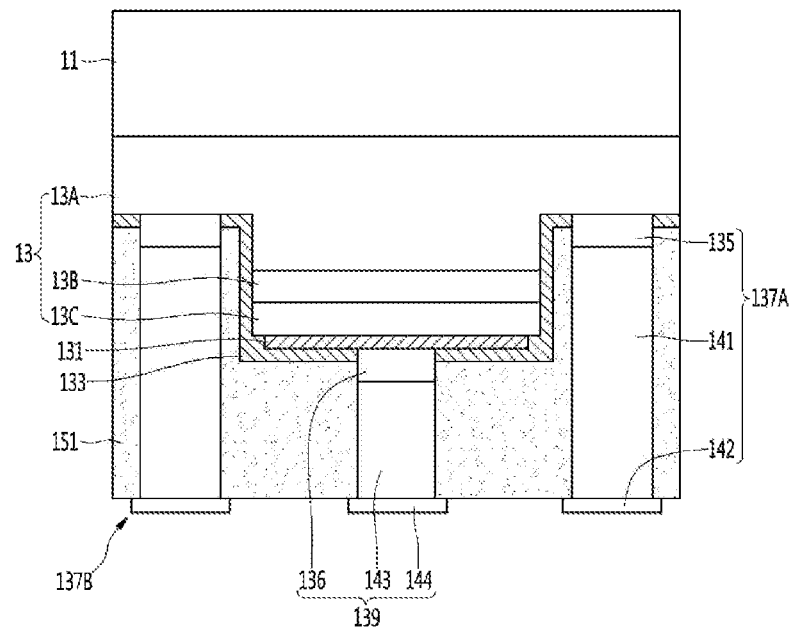
FIG. 20 is a view showing a third modification of the light emitting devices in the embodiment.
Figure 23:
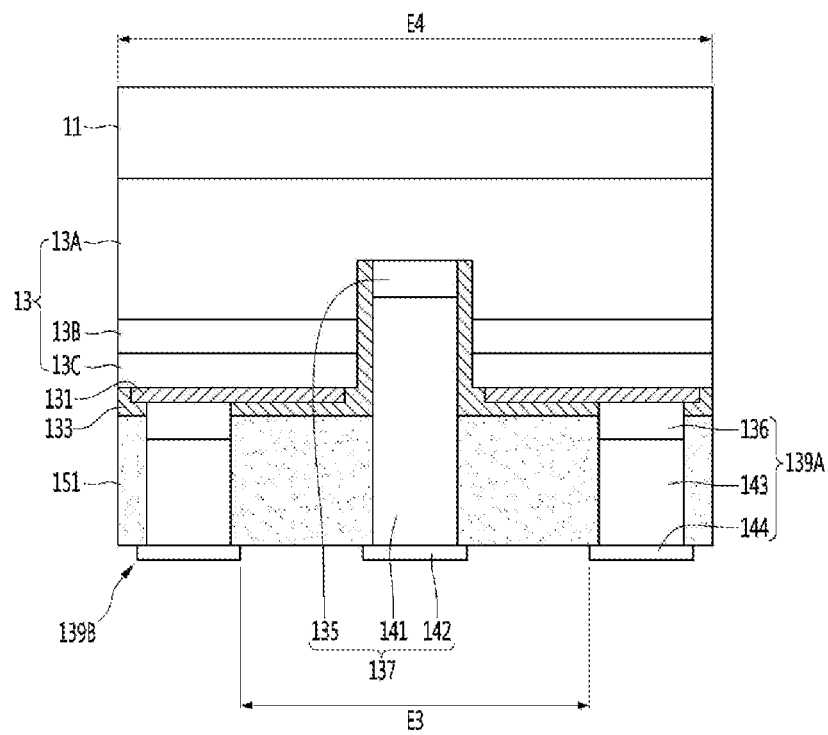
FIG. 23 is a view showing a fourth modification of the light emitting device in the embodiment.

FIGS. 20 and 23 show a modified example using a light emitting device of FIG. 18 in which the first electrode or the second electrode is disposed in a plurality and the number of the first electrode and the second electrode is different from each other. As described in FIGS. 20 and 23, disclosed in the above configuration and the same parts will be given with reference to the above description.

Referring to FIG. 20, a plurality of the first electrodes 137A and 137B of the light emitting device is spaced apart from each other and may be connected to the first conductive type semiconductor layer 13A. The second electrode 139 may be disposed between the plurality of first electrodes 137A and 137B. The plurality of first electrodes 137A and 137B may include the ferromagnetism material in at least one of the first bonding layer 142 and the first connection layer 141.

Figure 21:
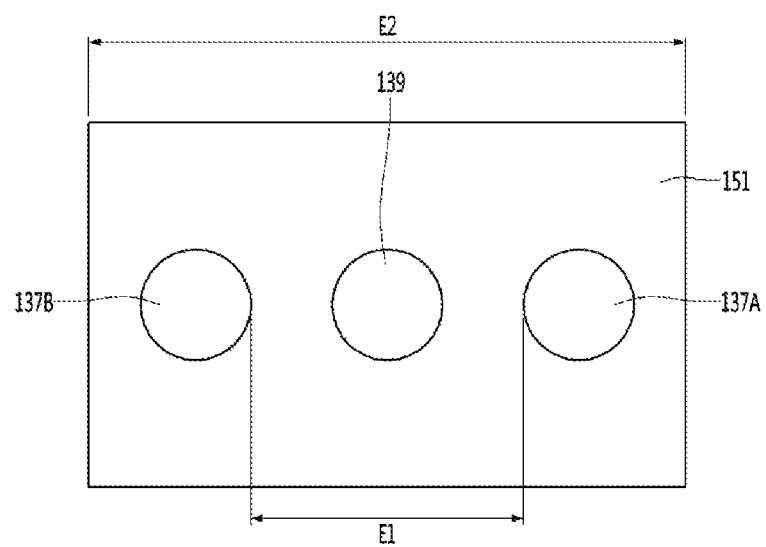
FIG. 21 is a view showing a bottom view of the light emitting device of FIG. 20.
Figure 22:
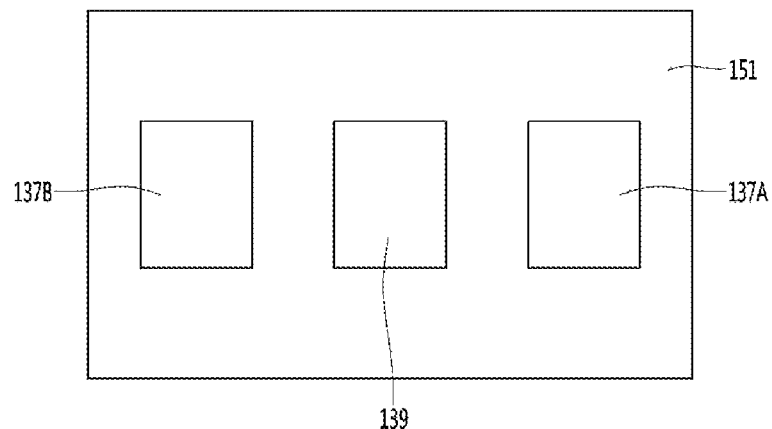
FIG. 22 is a view showing another example of the electrode of the light emitting device of FIG. 20.

As shown in FIGS. 21 and 22, the bottom shape of the first electrode 137A and 137B may be a circular shape or a polygonal shape, the second electrode 139 may be a circular shape or a polygonal shape. Here, an interval E1 between the plurality of first electrodes 137A and 137B may be equal to or greater than ½ of a width E2 of the first light emitting device 111 and the first electrodes 137A and 137B having the ferromagnetism material may be faced to be connected to the first lead electrodes 227 of the substrate 220 by the interval E1. Also, since the plurality of first electrodes 137A and 137B is disposed, it is easy to distinguish the anode or the cathode, for example, and a center region may always be the cathode (or anode). The first and second lead electrodes 227 and 229 of the substrate 220 of FIG. 2 may have a corresponding shape or a wide area than the first and second electrodes 137A, 137B and 139 of the light emitting device.

Referring to FIG. 23, a plurality of the second electrodes 139A and 139B of the light emitting device is spaced apart from each other and may be connected to the second conductive type semiconductor layer 13C. The first electrode 137 may be disposed between the plurality of second electrodes 139A and 139B. The plurality of first electrodes 137 may include the ferromagnetism material in at least one of the first bonding layer 142 and the first connection layer 141. Bottom shape of the first and second electrodes 137, 139A and 139B may be a circular shape or a polygonal shape. Here, the interval E3 between the plurality of second electrodes 139A and 139B may be equal to or greater than ½ of a width E4 of the light emitting device, and the first electrode 137 having the ferromagnetism material may be faced to be connected to the first lead electrode 227 of the substrate 220 at the center side by the interval E3. Also, since the plurality of second electrodes 139A and 139B is disposed, it is easy to distinguish the anode or the cathode, for example, for example, and a center region may be always the anode (or a cathode).

Figure 24:
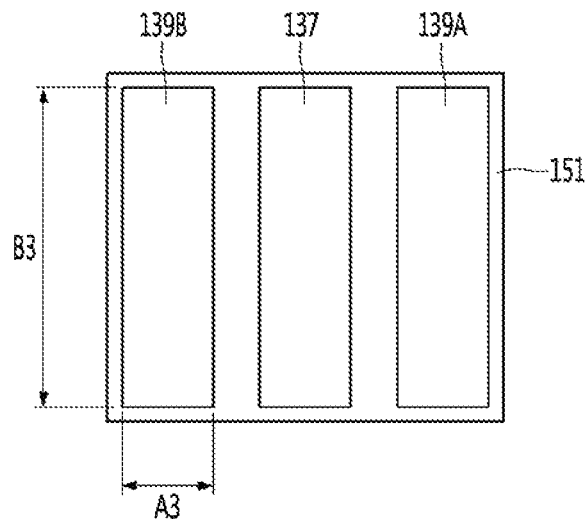
FIGS. 24 to 29 are a modified example of the electrode of the light emitting device of FIGS. 22 and 23 according to the embodiment.

FIG. 24 shows an example of the first and second electrodes in which a bottom shape may have a polygonal shape. The first and second electrodes 137, 139A and 139B may be arranged in a rectangular shape having a length B3 than a width A3, and the second electrodes 139A and 139B may be arranged on both sides of a center-side first electrode 137 in a rectangular shape. By providing the length B3 of the first and second electrodes 137, 139A and 139B, a heat radiation area may be increases, and the influence by the external magnetic force can be greatly exerted, and the attractive force or the repulsive force can be effectively applied. The first and second lead electrodes 227 and 229 of the substrate 220 of FIG. 2 may be a corresponding shape or a wider area than the first and second electrodes 137, 139A and 139B of the light emitting device.

Figure 25:
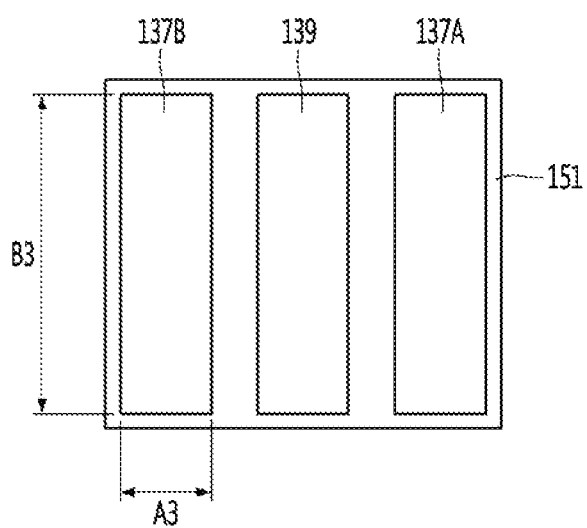

FIGS. 25 to 31 are a modified examples of the electrode of the light emitting device. Referring to FIG. 25, the first and second electrodes 137A, 137B and 139 may be a polygonal shape, for example, rectangular. The first and second electrodes 137A, 137B and 139 have a width A3 longer than a length B3, and plurality of first electrode 137A and 137B are disposed on a both sides of the center-side second electrode 139. By increasing the area of the plurality of first electrodes 137A and 137B, the space on the magnetic force may be increased, and the influence by the external magnetic force can be greatly exerted, and the attractive force or the repulsive force can be effectively applied. In FIGS. 24 and 25, the first electrode 137A and 137B and the second electrode 139 may have the same area, respectively. The first and second lead electrodes 227 and 229 of the substrate 220 of FIG. 2 may be a corresponding shape or a wider area than the first and second electrodes 137A, 137B and 139 of the light emitting device.

Figure 26:
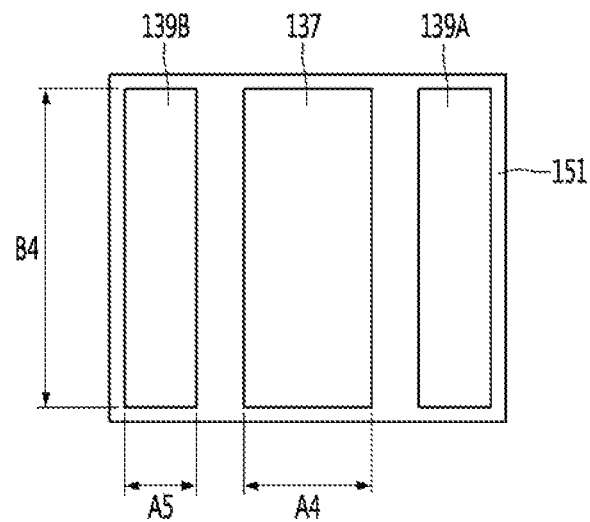

Referring to FIG. 26, a first electrode 137 of the light emitting device has a long length B4 and has a width A4 wider than a width A5 of each of the plurality of second electrodes 139A and 139B. Accordingly, a range of the center-side magnetic force of the first light emitting device 111 may be increased, and alignment of the light emitting devices before bonding may be facilitated. The first and second lead electrodes 227 and 229 of the substrate 220 of FIG. 2 may have a shape corresponding to that of the first and second electrodes 137, 139A and 139B of the light emitting device, or may have a wider area.

Figure 27:
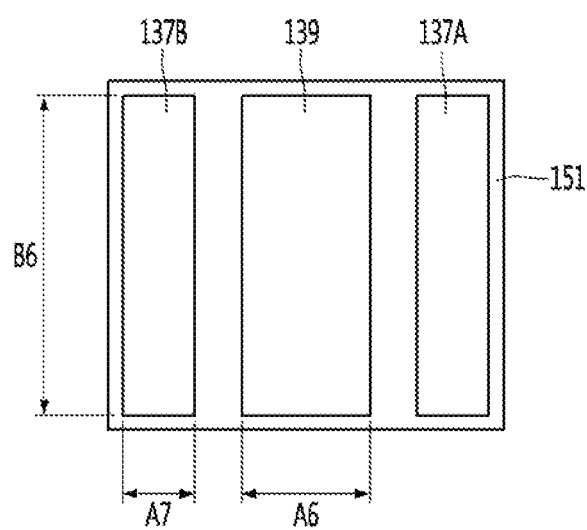

Referring to FIG. 27, the second electrode 139 of the light emitting device has a long length B6 and has a width A6 wider than a width A7 of each of the plurality of first electrodes 137A and 137B. Accordingly, since the first electrodes 137A and 137B on both sides of the light emitting device generate repulsive force with each other and the attractive force acts on the first electrodes 137A and 137B of the substrate 220, the alignment of the light emitting devices before bonding may be facilitated. The first and second lead electrodes 227 and 229 of the substrate 220 may have shapes corresponding to the first and second electrodes 137A, 137B, and 139 of the light emitting device, or may have a wider area.

Figure 28:
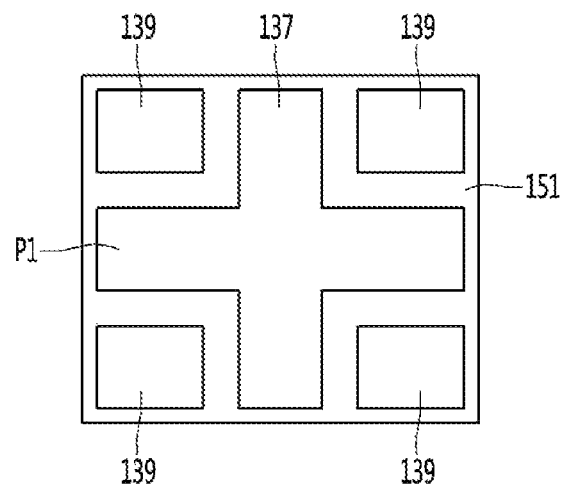

Referring to FIG. 28, a first electrode 137 of the light emitting devices has the ferromagnetism material and is disposed in a cross shape or cross shape, and each second electrode 139 may be provided between the protrusions P1 of the first electrode 137. Accordingly, by increasing an area of the first electrode 137, it is possible to improve the magnetic force, by increasing the number of the second electrode 139 may have a diffuse current.

Figure 29:
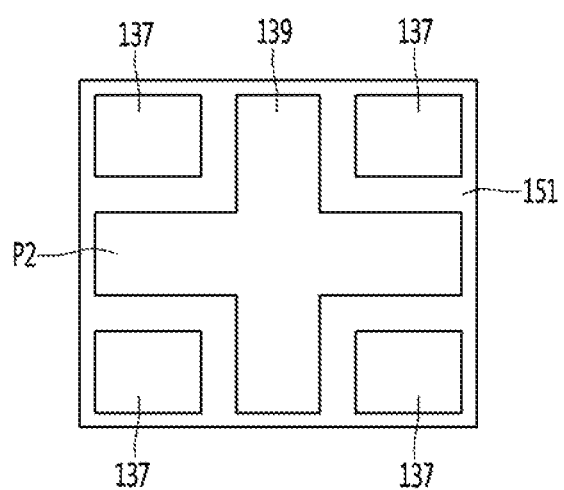

Referring to FIG. 29, a first electrode 137 of the light emitting device has the ferromagnetism material and may be disposed on an outside of the second electrode 139 with a cross-shaped or cross-shape, respectively. Each first electrode 137 is provided between the protrusions P2 of the second electrode 139, and the magnetic force may be increased and a current diffusion may be improved by the first electrode 137.

Figure 30:
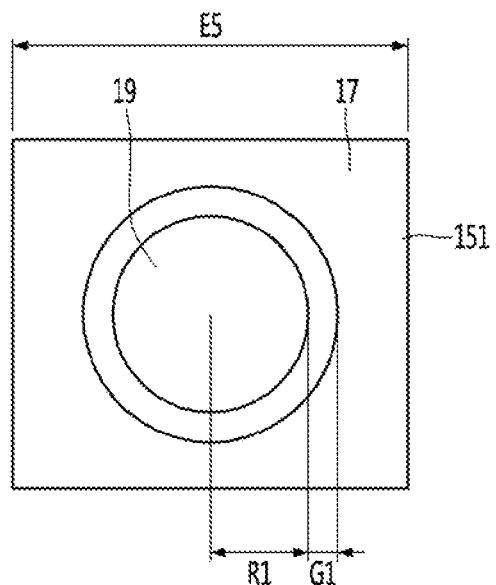
FIGS. 30 and 31 are a view showing another example of an electrode of the light emitting device according to an embodiment.

Referring to FIG. 30, a first electrode 17 of the light emitting device has a circular shape on the center side thereof, and the second electrode 19 is on the periphery of the first electrode 17. Radius R1 of the first electrode 17 may be disposed to be less than one third of a width E5 of the bottom surface of the light emitting device, when the radius R1 of the first electrode 17 is large, the first and second electrodes 17 and 19 have a problem that the heat radiation characteristics are not uniform. The first and second electrodes 17 and 19 are separated by a predetermined gap G1 to prevent electrical interference.

Figure 31:
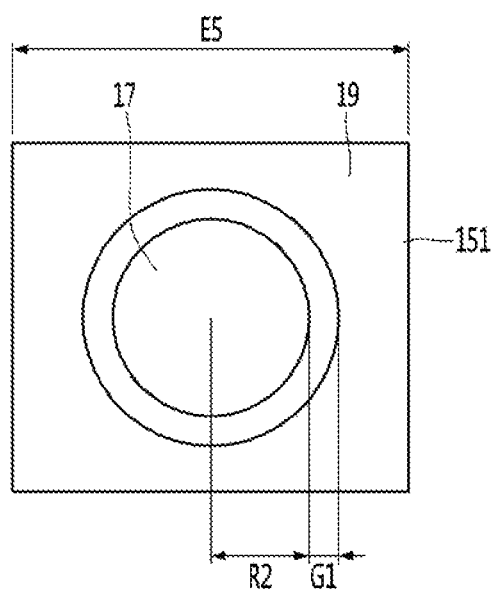

Referring to FIG. 31, the second electrode 19 of the light emitting device may has a circular shape on the center-side thereof and the first electrode 17 is disposed on the periphery of the second electrode 19. A radius R2 of the second electrode 19 may be disposed to be less than one third of the width E5 of the bottom surface of the light emitting device, when the radius R2 of the first electrode 17 is large, the first and second electrodes 17 and 19 have a problem that the heat radiation characteristics are not uniform. The first and second electrodes 17 and 19 are separated by a predetermined gap G1 to prevent electrical interference.

Figure 32:
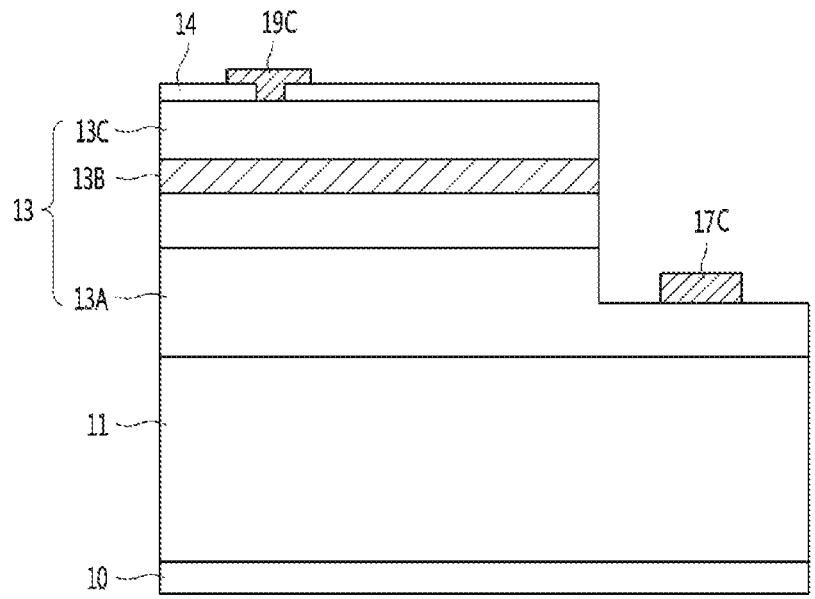
FIG. 32 is a view showing a fifth modification of the light emitting device according to conduct.

FIG. 32 shows a fifth modification of the light emitting device according to the embodiment, showing a horizontal chip structure.

Referring to FIG. 32, the light emitting device may include a metal layer 10 disposed under the substrate 11, and the metal layer 10 may include the ferromagnetism material disclosed embodiment. In addition, when the substrate 11 is a conductive substrate, the metal layer 10 may function as an electrode without forming the first electrode 17C. An electrode layer 13 and a second electrode 19C may be disposed on the light emitting structure 13.

Figure 33:
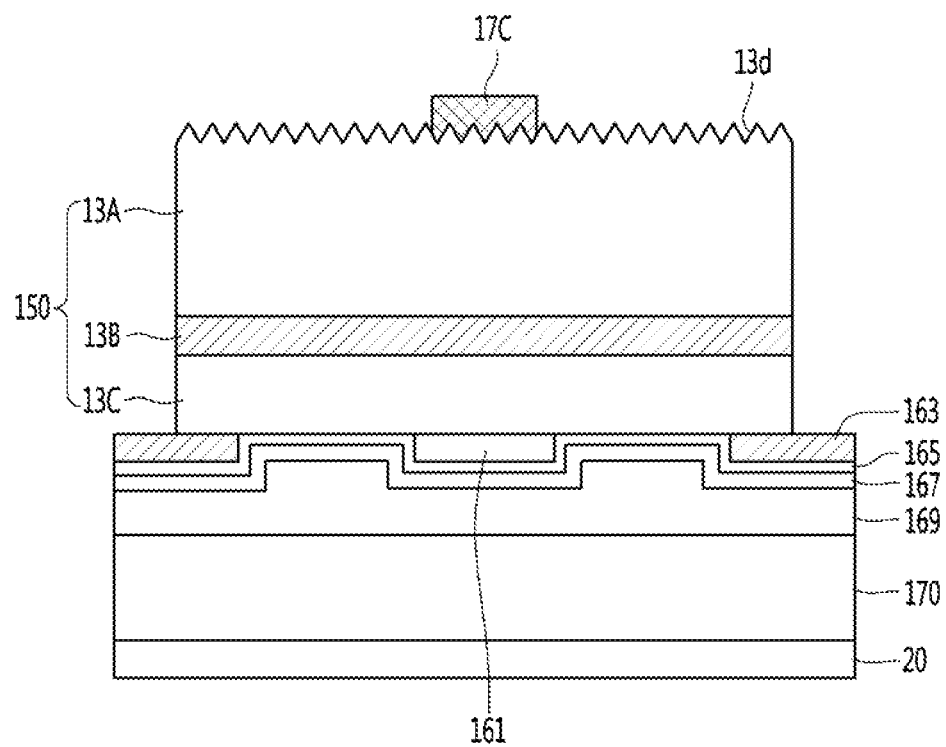
FIG. 33 is a view showing a sixth modification of the light emitting device according to an embodiment.

FIG. 33 shows a sixth modification of the light emitting device according to the embodiment, showing a structural diagram of the vertical type chip.

Referring to FIG. 33, the light emitting device may include a metal layer 20 having the ferromagnetism material according to the embodiment thereunder. The light emitting device includes a current blocking layer 161, a channel layer 163, a contact layer 165, a reflection layer 167, a bonding layer 169, a conductive support member 170, and a metal layer 20. The current blocking layer 161 may include at least one of $SiO_2$, $SiO_x$, $SiO_xN_y$, $Si_3N_4$, $Al_2O_3$, and $TiO_2$, and at least one of the current blocking layer 161 may formed between the channel blocking layers 161. The current blocking layer 161 may disposed on a lower surface of the light emitting structure 13 and is disposed to correspond to a thickness direction of the first electrode 17C and the light emitting structure 13. The current blocking layer 161 may cut off the supplied current and diffuse it to another path.

The channel layer 163 is formed along the bottom edge of the second conductive type semiconductor layer 13C and may be formed in a ring shape, a loop shape, or a frame shape. The channel layer 163 may include at least one of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$. The inner side of the channel layer 163 is disposed under the second conductivity type semiconductor layer 13C and the outer side of the channel layer 163 is disposed outside the side surface of the light emitting structure 13.

The contact layer 165 may be a low conductive material such as ITO, IZO, IZTO, IAZO, IGZO, IGTO, AZO, ATO, or may be a metal of Ni or Ag. The reflective layer 167 may formed of a structure including at least one layer made of a material selected from the group consisting of Ag, Ni, Al, Rh, Pd, Ir, Ru, Mg, Zn, Pt, and Au. The reflective layer 167 may be in contact with the second conductive semiconductor layer 13C under an ohmic contact with a metal or with a low conductive material such as ITO, but the present invention is not limited thereto. The bonding layer 169 is formed under the reflective layer 167, may be used as a barrier metal or a bonding metal, and the material may be Ti, Au, Sn, Ni, Cr, Ga, In, Bi, Cu, Ag, and Ta and an optional alloy.

The conductive support member 170 is formed under the bonding layer 169 and the support member 170 is formed of a metal such as Cu-copper, Au-gold, Ni-nickel, molybdenum Mo, Cu—W, or a carrier wafer such as Si, Ge, GaAs, ZnO, SiC, or the like. The upper surface of the first conductivity type semiconductor layer 13A may be formed with a light extracting structure 13d such as a roughness.

The metal layer 20 may be disposed below the conductive support member 170 and may be aligned on the lead electrode of the substrate by a ferromagnetism material.

Figure 34:
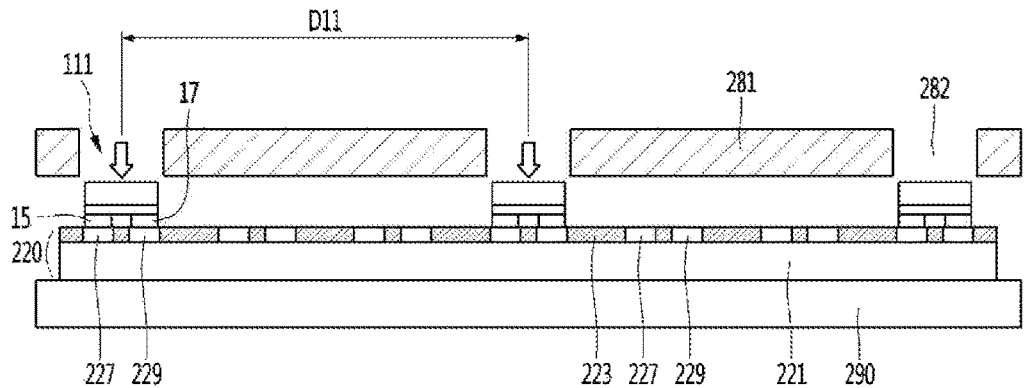
FIGS. 34 to 36 are a view showing an example of the substrate aligned with the first, second, and third light emitting device according to an embodiment.
Figure 35:
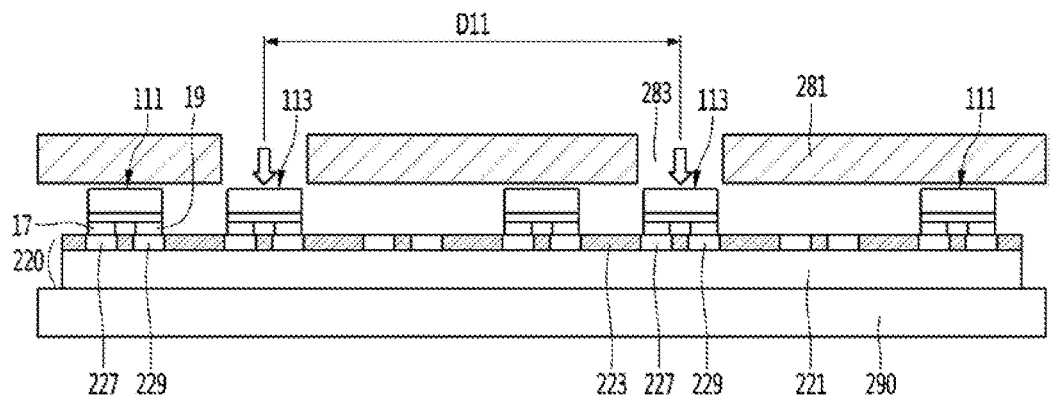
Figure 36:
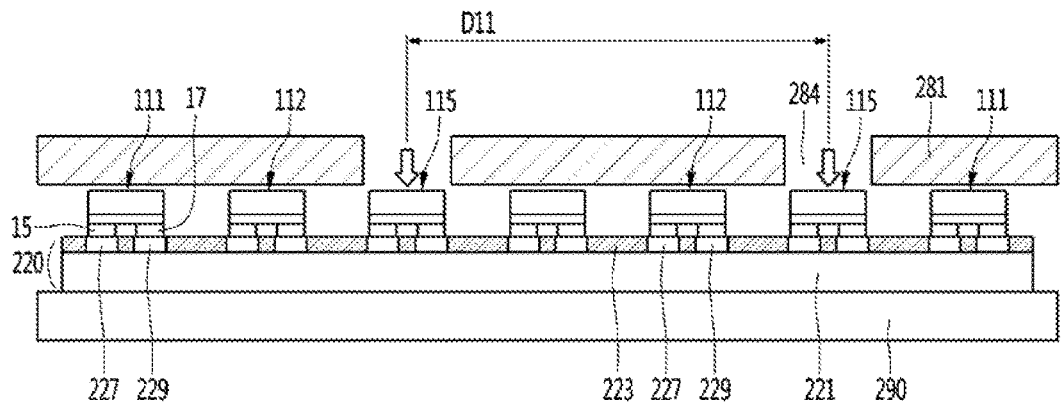

FIGS. 34 to 36 are views showing the structure was arranged on a substrate in the order of first, second, and third light emitting devices.

As shown in FIG. 34, the plurality of first light emitting devices 111 according to the embodiment are brought into close contact with the substrate 220 through a first openings 282 of a guide sheet 281. As shown in FIG. 35, a plurality of second light emitting devices 113 are brought into close contact with the substrate 220 through a second opening 283 of the guide sheet 281. As shown in FIG. 36, the plurality of third light emitting devices 115 are brought into close contact with the substrate 220 through a third opening 284 of the guide sheet 281. At this time, an electromagnet tray 290 is disposed under the substrate 220 to supply current when the first, second, and third light emitting devices 111, 113, and 115 are aligned. The guide sheets 281 for aligning the first, second and third light emitting devices 111, 113 and 115 may be different sheets or the same sheet. If the sheets are the same, an interval D11 of the first and second light emitting devices 111 may be the same. In the reflow process, the first, second and third light emitting devices 111, 113, and 115 are thermally bonded to each other through the cover 262 to be metal-bonded to the substrate 220. The guide sheet may be a mask layer.

Figure 37:
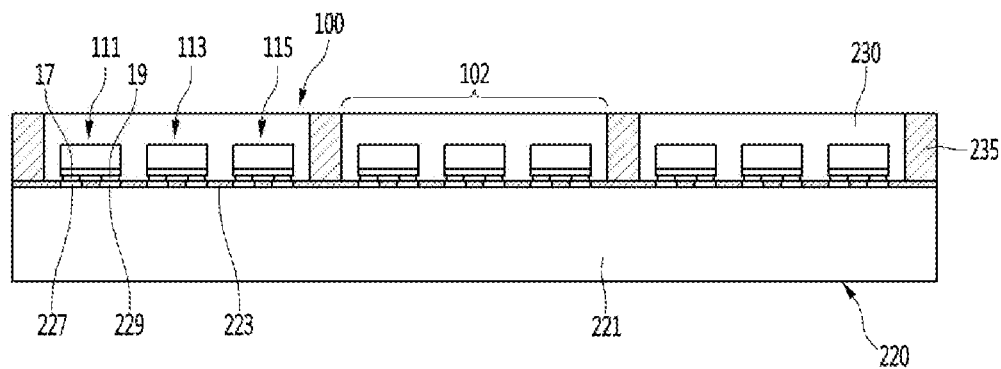
FIG. 37 is a view showing a pixel region in a light emitting module according to an embodiment.

FIG. 37 is a view illustrating an example of a light emitting module according to an embodiment. First, second and third light emitting devices 111, 113 and 115 are disposed in each of the light emitting units 100, and the first, second and third light emitting devices 111 may form one pixel region 102. A black matrix 235 is disposed in the boundary region of the pixel region to block optical interference between the pixels.

Figure 38:
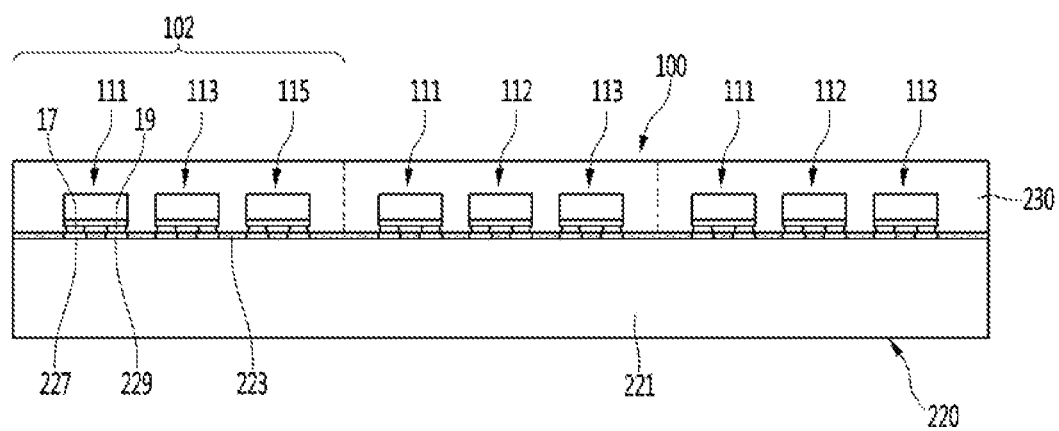
FIG. 38 is a view showing a first modified example of the pixel region of the light emitting module according to an embodiment.

FIG. 38 shows an example of a light emitting module according to the embodiment. First, second and third light emitting devices 111, 113 and 115 are arranged in each of the light emitting units 100, and the first, second and third light emitting devices 111 may form one pixel region 102. A light transmitting layer 230 may be disposed on the pixel region 102 and the boundary region thereof. This may reduce optical interference between adjacent pixels due to the recti linearity of light of the first, second, and third light emitting devices 111, 113, and 115, so that a separate black matrix may not be formed.

Figure 39:
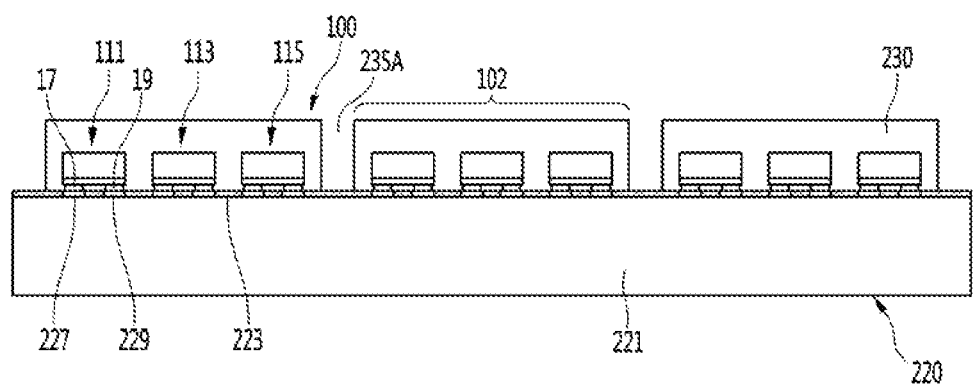
FIG. 39 is a view showing a second modification of the pixel region of the light emitting module according to an embodiment.

FIG. 39 shows an example of a light emitting module according to an embodiment. First, second and third light emitting devices 111, 113 and 115 are disposed in each of the light emitting units 100, and the first, second and third light emitting devices 111 may form one pixel region 102. An air region 235A from which the light transmitting layer 230 is removed may be disposed in a boundary region of the pixel region 102. This may reduce the optical interference between the pixels, so that a separate black matrix may not be formed.

Figure 40:
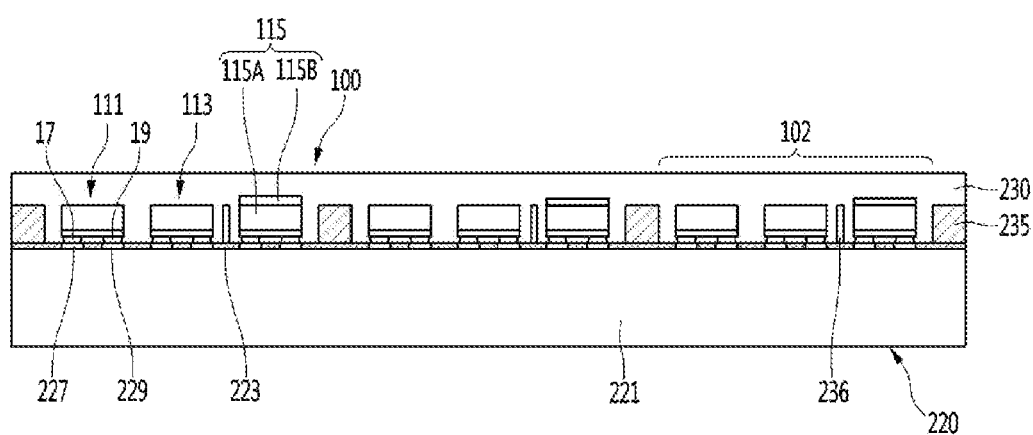
FIG. 40 is a view showing a third modification of the pixel region of the light emitting module according to an embodiment.

FIG. 40 shows an example of a light emitting module according to the embodiment. First, second and third light emitting devices 111, 113 and 115 are arranged in each of the light emitting units 100, and the first, second and third light emitting devices 111 may form one pixel region 102. A black matrix 235 is disposed in the boundary region of the pixel region 102 to block optical interference therebetween. The thickness of the black matrix 235 may be lower than the thickness of the light transmitting layer 230, so that material loss can be reduced.

The third light emitting device 115, for example, a red light emitting device, may include a structure in which a blue light emitting diode 115A and a red phosphor layer 115B are stacked. Accordingly, it is possible to solve the heat problem caused by the red LED. A partition wall 236 using a black matrix is disposed around the third light emitting device 115 to reduce light distortion caused by the blue light emitting diode.

The first, second and third light emitting devices 111, 113 and 115 according to the embodiment may be selectively applied to the detailed configuration of the LED chip and the electrode structure disclosed in the above-described process, it is not limited to the one embodiment.

A light emitting module according to an embodiment is not as well as the display device, the electronic board, a lighting unit, indication unit, a lamp, street light, in the vehicle lighting devices, vehicle display devices, but be applied to a timepiece like.

The features, structures, effects and the like described in the embodiments are included in at least one embodiment and are not necessarily limited to one embodiment. Furthermore, the features, structures, effects and the like illustrated in the embodiments can be combined and modified by other persons skilled in the art to which the embodiments belong. Accordingly, the contents of such combinations and modifications should be interpreted as being included in the scope of the embodiments.

While the present invention has been particularly shown and described with reference to exemplary embodiments thereof, it is to be understood that the invention is not limited to the disclosed embodiments, but, on the contrary, it can be seen that the modification and application of branches are possible. For example, each component specifically shown in the embodiments can be modified and implemented. It is to be understood that the present invention may be embodied in many other specific forms without departing from the spirit or essential characteristics thereof.

INDUSTRIAL APPLICABILITY

The light emitting module of the present invention may be used in the display device.

The light emitting module of the present invention may be used in the match.

The invention may be used in the illumination unit, the instruction unit, each longitudinal lamp, or lamp.

The invention claimed is:

1. A light emitting module comprising:
a substrate;
a first lead electrode and a second lead electrode disposed on the substrate and electrically separated from each other; and
at least one light emitting device disposed on the substrate,
wherein the light emitting device includes:
a first electrode facing the first lead electrode and including a ferromagnetic material, and
a second electrode facing the second lead electrode and including a diamagnetic material,
wherein the second lead electrode includes a diamagnetic material,
wherein the first lead electrode comprises a ferromagnetic material,
wherein at least one of the first lead electrode and the first electrode includes a first bonding layer,
wherein the first bonding layer has the ferromagnetic material of the first electrode,
wherein at least one of the second lead electrode and the second electrode includes a second bonding layer,
wherein the second bonding layer has the diamagnetic material of the second lead electrode,
wherein the light emitting module includes a plurality of pixel regions on the substrate,
wherein the light emitting device includes a plurality of light emitting devices and the plurality of light emitting devices are disposed in each of the pixel regions, and
wherein each of the light emitting devices disposed in each pixel region includes first to third light emitting devices for emitting light of different color from each other.

2. The light emitting module of claim 1, wherein the second lead electrode is formed of a diamagnetic material.

3. The light emitting module of claim 1, wherein the ferromagnetic material includes a nickel (Ni), and the diamagnetic material includes a copper (Cu).

4. The light emitting module of claim 1, wherein the first bonding layer has a thickness greater than a thickness of the first lead electrode, and
wherein the second bonding layer has a thickness greater than a thickness of the second lead electrode.

5. The light emitting module of claim 1, wherein the first electrode and the second electrode are spaced apart from each other.

6. The light emitting module of claim 1, comprising a light transmitting layer covering the first to third light emitting devices and disposed on the substrate,
wherein the first to third light emitting devices includes a light emitting diode, and
wherein the first and second electrodes of the first to third light emitting devices is metal-bonded to the first and second lead electrodes of the substrate by the first and second bonding layer.

7. The light emitting module of claim 6, comprising a protective layer of a black matrix material and a black matrix between the pixel regions, on the substrate.

8. A display device comprising:
a substrate including first and second lead electrodes;
a plurality of light emitting units on the substrate; and
a black matrix surrounding the plurality of light emitting units, respectively,
wherein each of the plurality of the light emitting units includes:
at least three light emitting devices forming each pixel region and disposed on the substrate; and
a light transmitting layer on the substrate,
wherein the light emitting device includes a first electrode facing the first lead electrode and including a ferromagnetic material, and a second electrode facing the second lead electrode and including a diamagnetic material,
wherein the second lead electrode includes a diamagnetic material,
wherein at least one of the first lead electrode and the first electrode includes a first bonding layer,
wherein the first bonding layer has the ferromagnetic material of the first electrode, wherein at least one of the second lead electrode and the second electrode includes a second bonding layer,
wherein the second bonding layer has the diamagnetic material of the second lead electrode,
wherein the at least three light emitting devices include first to third light emitting devices emitting different colors, and
wherein the first and second electrodes of the first to third light emitting devices are connected to the first and second lead electrodes of the substrate by the first and second bonding layers.

9. The display device of claim 8, wherein the first lead electrode includes a ferromagnetic material, and
wherein the second lead electrode includes a diamagnetic material.

10. A light emitting module comprising:
a substrate on which a first lead electrode and a second lead electrode are disposed;
a plurality of light emitting devices disposed on the substrate; and
a light transmitting layer covering the plurality of light emitting devices,
wherein the plurality of light emitting devices include:
   a first light emitting device including a first light transmitting substrate and a first light emitting structure disposed under the first light transmitting substrate;
   a second light emitting device including a second light transmitting substrate and a second light emitting structure disposed under the second light transmitting substrate; and
   a third light transmitting device including a third light transmitting substrate and a third light emitting structure disposed under the third light transmitting substrate,
wherein the first to third light emitting devices include first and second electrodes disposed under the first to third light emitting structures, respectively,
wherein the first electrode comprises:
   a first layer disposed under each of the first to third light emitting structures and including an adhesive material or a diffusion barrier material;
   a second layer disposed under the first layer and including a ferromagnetic material; and
   a third layer disposed under the second layer and including a bonding material, and
wherein the second electrode includes at least two metal layers.

11. The light emitting module of claim 10, wherein the first electrode includes at least five metal layers, and
wherein the second electrode includes at least four metal layers and has a different number from a number of the metal layers of the first electrode.

12. The light emitting module of claim 10, wherein the first electrode and the second electrode include a layer formed of gold in the lowest layer.

13. The light emitting module of claim 10, wherein the first electrode includes a plurality of second layers having the ferromagnetic material, and
wherein the first electrode includes an adhesive layer between the plurality of second layers.

14. The light emitting module of claim 10, wherein the first lead electrode includes a ferromagnetic material.

15. The light emitting module of claim 10, wherein the second lead electrode is formed of a diamagnetic material.

16. The light emitting module of claim 14, wherein at least one of the first lead electrode and the first electrode includes a first bonding layer,
wherein at least one of the second lead electrode and the second electrode includes a second bonding layer,
wherein the first bonding layer includes a metal contained in the first electrode,
wherein the second bonding layer includes a metal contained in the second lead electrode, and
wherein the light emitting module includes a black matrix disposed around the light transmitting layer.

* * * * *